US011240796B2

(12) United States Patent
Lin et al.

(10) Patent No.: US 11,240,796 B2
(45) Date of Patent: Feb. 1, 2022

(54) WIRELESS COMMUNICATION BLOCK INTERLEAVING

(71) Applicant: Telefonaktiebolaget LM Ericsson (publ), Stockholm (SE)

(72) Inventors: Xingqin Lin, Santa Clara, CA (US); Jung-Fu Cheng, Fremont, CA (US); Stefan Parkvall, Bromma (SE); Havish Koorapaty, Saratoga, CA (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/960,203

(22) PCT Filed: Jan. 10, 2019

(86) PCT No.: PCT/IB2019/050201
§ 371 (c)(1),
(2) Date: Jul. 6, 2020

(87) PCT Pub. No.: WO2019/138358
PCT Pub. Date: Jul. 18, 2019

(65) Prior Publication Data
US 2021/0058908 A1   Feb. 25, 2021

Related U.S. Application Data

(60) Provisional application No. 62/616,828, filed on Jan. 12, 2018.

(51) Int. Cl.
*H04W 72/04* (2009.01)
*H04L 5/00* (2006.01)
(52) U.S. Cl.
CPC ......... *H04W 72/042* (2013.01); *H04L 5/0053* (2013.01); *H04L 5/0007* (2013.01)

(58) Field of Classification Search
CPC ... H04L 5/0007; H04L 1/0071; H04L 1/0041; H03M 13/27
See application file for complete search history.

(56) References Cited

U.S. PATENT DOCUMENTS

2015/0023290 A1    1/2015  Tang et al.
2018/0227156 A1*   8/2018  Papasakellariou .......................... H04W 72/0453

(Continued)

OTHER PUBLICATIONS

3GPP TS 38.211 V15.0.0 (Dec. 2017)—Technical Specification (Year: 2017).*

(Continued)

*Primary Examiner* — Aristocratis Fotakis
(74) *Attorney, Agent, or Firm* — Christopher & Weisberg, P.A.

(57) ABSTRACT

Apparatuses and methods are disclosed for block interleaving. In one embodiment, a method includes generating an interleaver sequence for a control resource set, CORESET, configuration for a physical downlink control channel, the interleaver sequence associated with an interleaving matrix; optionally, for each one of an allowed value of number of rows for the interleaving matrix, determining a number of null entries to be added to the interleaving matrix; and selecting a number of rows, R, for the interleaving matrix such that the number of null entries to be added to the interleaving matrix is: no more than a number of columns, C, of the interleaving matrix; and optionally, the smallest among the numbers of null entries determined for each of the allowed values of number of rows for the interleaving matrix. In another embodiment, a method includes decomposing the interleaver sequence.

24 Claims, 14 Drawing Sheets

(56) References Cited

U.S. PATENT DOCUMENTS

| | | | |
|---|---|---|---|
| 2018/0359755 A1* | 12/2018 | Sun | H04L 5/0053 |
| 2019/0069276 A1* | 2/2019 | Kwak | H04L 1/00 |
| 2019/0089486 A1* | 3/2019 | Kim | H04L 1/0038 |
| 2019/0246395 A1* | 8/2019 | Huang | H04W 72/0446 |
| 2020/0022121 A1* | 1/2020 | Li | H04L 5/0035 |
| 2020/0068540 A1* | 2/2020 | Wang | H04L 5/0051 |
| 2020/0374036 A1* | 11/2020 | Seo | H04L 25/03 |

OTHER PUBLICATIONS

R1-1800943, On PDCCH structure, 3GPP TSG-RAN WG1 AH-1801, Ericsson, Vancouver, Canada, Jan. 22-26, 2018 (Year: 2018).*

R1-1717641, On PDCCH structure, 3GPP TSG RAN WG1 Meeting 90bis, Samsung, Prague, CZ, Oct. 9-13, 2017 (Year: 2017).*

R1-1801002, Corrections on PDCCH Structure, 3GPP TSG RAN WG1 Meeting AH 1801, Samsung, Vancouver, Canada, Jan. 22-26, 2018 (Year: 2018).*

R1-1717039, Further details on PDCCH structure, 3GPP TSG RAN WG1 Meeting 90bis, ZTE, Prague, CZ, Oct. 9-13, 2017 (Year: 2017).*

3GPP TS 36.212 V14.4.0 (Sep. 2017) 3rd Generation Partnership Project; Technical Specification Group Radio Access Network; Evolved Universal Terrestrial Radio Access (E-UTRA); Multiplexing and Channel Coding (Release 14), consisting of 198 pages.

International Search Report and Written Opinion dated Apr. 25, 2019 issued in PCT Application No. PCT/IB2019/050201, consisting of 12 pages.

Huawei, HiSilicon, 3GPP TSG RAN WG1 Meeting #91; R1-1719386; Agenda Item: 7.3.1.1; Title: On NR-PDCCH Structure; Document for: Discussion and Decision; Reno, USA, Nov. 27-Dec. 1, 2017, consisting of 7 pages.

Huawei, HiSilicon, 3GPP TSG RAN WG1 Ad Hoc Meeting; R1-1800817; Agenda Item: 7.3.1.5; Title: Remaiing Issues and TP on Interleaved CCE-to-REG Mapping; Document for: Discussion and Decision; Vancouver, Canada, Jan. 22-26, 2018, consisting of 5 pages.

3GPP TS 36.211 V15.0.0 (201712) 3rd Generation Partnership Project; Technical Specification Group Radio Access Network; Evolved Universal Terrestrial Radio Access (E-UTRA); Physical Channels and Modulation (Release 15), consisting of 219 pages.

3GPP TS 38.211 V15.0.0 (201712) 3rd Generation Partnership Project; Technical Specification Group Radio Access Network; NR; Physical Channels and Modulation (Release 15), consisting of 73 pages.

* cited by examiner

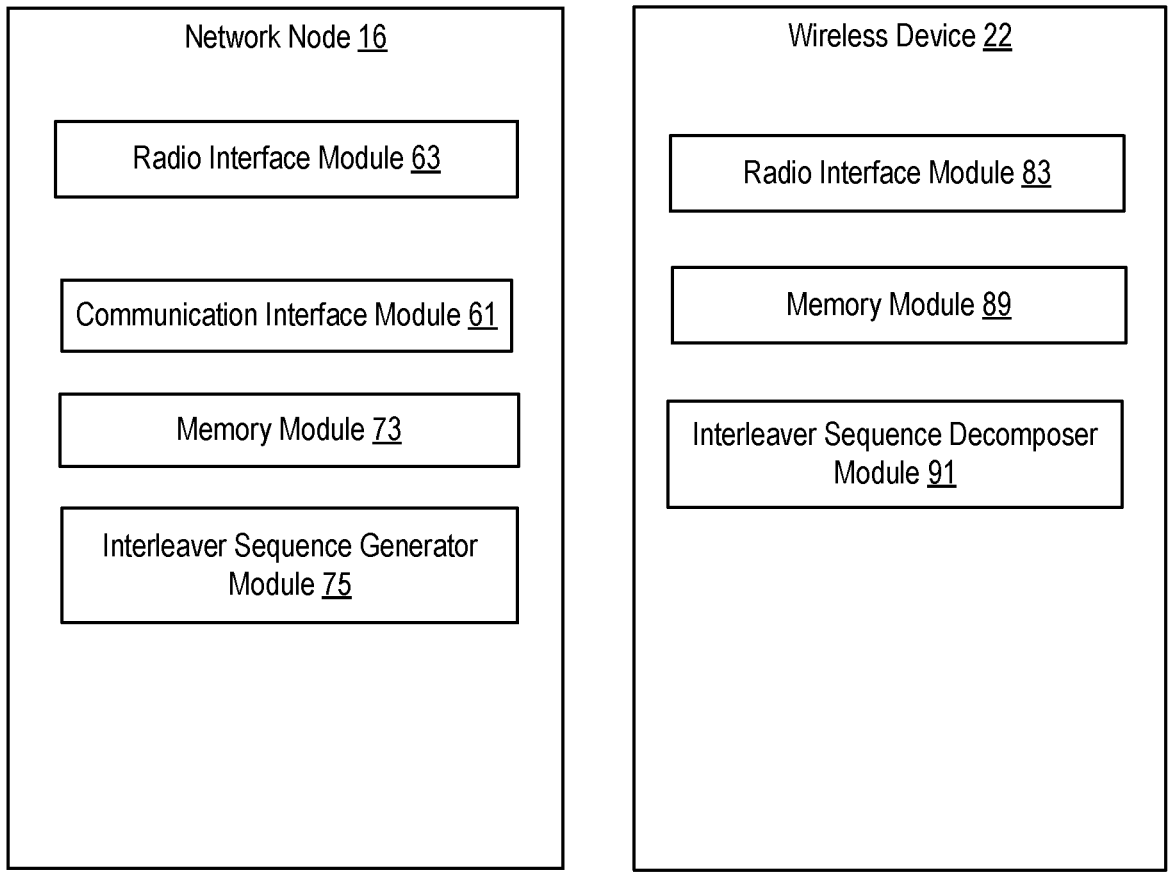
FIG. 8
FIG. 9
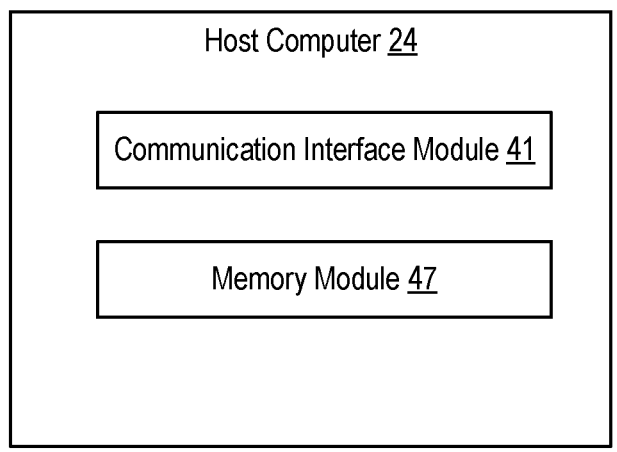
FIG. 7

FIG. 17

WIRELESS COMMUNICATION BLOCK INTERLEAVING

CROSS-REFERENCE TO RELATED APPLICATIONS

This application is a Submission Under 35 U.S.C. § 371 for U.S. National Stage Patent Application of International Application No.: PCT/IB2019/050201, filed Jan. 10, 2019 entitled "WIRELESS COMMUNICATION BLOCK INTERLEAVING," which claims priority to U.S. Provisional Application No. 62/616,828, filed Jan. 12, 2018, entitled "WIRELESS COMMUNICATION BLOCK INTERLEAVING," the entireties of both of which are incorporated herein by reference.

TECHNICAL FIELD

Wireless communication and in particular, to wireless communication block interleaving.

BACKGROUND

New Radio (NR) uses orthogonal frequency division multiplexing (OFDM) in the downlink (DL). The basic NR downlink physical resource can thus be seen as a time-frequency grid as illustrated in FIG. 1 where each resource element corresponds to one OFDM subcarrier during one OFDM symbol interval. Multiple sub-carrier spacings are supported in NR. FIG. 1 illustrates the case where the sub-carrier spacing is 15 kHz.

PDCCHs (physical downlink control channels) are used in NR for downlink control information (DCI), e.g., downlink scheduling assignments and uplink (UL) scheduling grants. The PDCCHs are in general transmitted at the beginning of a slot and relate to data in the same or a later slot (for mini-slots PDCCH can also be transmitted within a regular slot). Different formats (sizes) of the PDCCHs are possible to handle different DCI payload sizes and different aggregation levels (i.e., different code rate for a given payload size). A wireless device (WD) is configured (implicitly and/or explicitly) to blindly monitor (or search) for a number of PDCCH candidates of different aggregation levels and DCI payload sizes. Upon detecting a valid DCI message (i.e., the decoding of a candidate is successful and the DCI contains an identification (ID) the WD is told to monitor) the WD follows the DCI (e.g., receives the corresponding downlink data or transmits in the uplink). The blind decoding process comes at a cost in complexity in the WD but is required to provide flexible scheduling and handling of different DCI payload sizes.

Different NR use-cases (e.g., mobile broadband (MBB), URLLC) require different control regions (e.g., time, frequency, numerologies etc.) and PDCCH configurations (e.g., operating points etc.). PDCCHs in NR are transmitted in configurable/dynamic control regions called control resource sets (CORESET) enabling variable use-cases. A CORESET is a subset of the downlink physical resource configured to carry control signaling. It is analogous to the control region in Long Term Evolution (LTE) but generalized in the sense that the set of physical resource blocks (PRBs) and the set of OFDM symbols in which it is located is configurable.

CORESET configuration in frequency allocation is done in units of 6 resource blocks (RBs) using NR DL resource allocation Type 0: bitmap of RB groups (RBGs). CORESET configuration in time spans of 1-3 consecutive OFDM symbols. For slot based scheduling, the CORESET span at the beginning of a slot is at most 2 if demodulation reference signal (DMRS) is located in OFDM Symbol (OS) #2 and is at most 3 if DMRS is located in OS #3. A WD monitors one or more CORESETs. Multiple CORESETs can be overlapped in frequency and time for a WD. FIG. 2 shows an illustration of CORESET configurations.

The resource elements (REs) in a CORESET are organized in REGs (resource element groups). Each REG consists of the 12 REs of one OFDM symbol in one RB, as illustrated in FIG. 3. REGs within a CORESET are numbered in increasing order in a time-first manner, starting with 0 for the first OFDM symbol and the lowest-numbered RB in the CORESET.

A PDCCH is confined to one CORESET. A PDCCH is carried by 1, 2, 4, 8 or 16 CCEs (control channel elements). Each CCE consists of 6 REGs. The number of CCEs of a PDCCH is referred to as the aggregation level (AL) of the PDCCH. In 3GPP Rel-15, PDCCH payload size is at least 12 bits before the cyclic redundancy check (CRC). If the payload is smaller, zero-padding is applied to obtain 12 bits. Scrambling of PDCCH is supported, for which the same length-31 Gold sequence as for LTE is used.

The REGs can be configured to form REG bundles. The allowed REG bundle sizes depend on the CORESET length.
  CORESET length of 1 OS: The allowed REG bundle sizes are 2 and 6.
  CORESET length of 2 OSs: The allowed REG bundle sizes are 2 and 6.
  CORESET length of 3 OSs: The allowed REG bundle sizes are 3 and 6.

The CCE-to-REG mapping for a CORESET can be interleaved or non-interleaved. Interleaving operates on the REG bundles. The interleaving pattern is defined by a rectangular matrix: the number of rows, R, is configured from {2, 3, 6}, and the number of columns is P/R, where P is the total number of REG bundles for the given CORESET. REG bundles are written row-wise and read column-wise. Cyclic shift of the interleaving unit is applied based on a configurable ID with range 0-274.

The CCE-to-REG mapping for a control-resource set can be interleaved or non-interleaved, configured by the higher-layer parameter CORESET-CCE-REG-mapping-type, and is described by REG bundles:

REG bundle i is defined as REGs $\{iL, iL+1, \ldots, iL+L-1\}$ where L is the REG bundle size, $i = 0, 1, \ldots, N_{REG}^{CORESET}/L-1$, and $N_{REG}^{CORESET} = N_{RB}^{CORESET} N_{symb}^{CORESET}$ is the number of REGs in the CORESET CCE j consists of REG bundles $\{f(6j/L), f(6j/L+1), \ldots, f(6j/L+6/L-1)\}$ where $f(\bullet)$ is an interleaver For non-interleaved CCE-to-REG mapping, L=6 and f(j)=j
For interleaved CCE-to-REG mapping, $L \in \{2,6\}$ for $N_{symb}^{CORESET}=1$ and $L \in \{N_{symb}^{CORESET}, 6\}$ for $N_{symb}^{CORESET} \in \{2,3\}$ where L is configured by the higher-layer parameter CORESET-REG-bundle-size. The interleaver is defined by $$f(j) = (rC + c + n_{shift}) \bmod (N_{REG}^{CORESET}/L)$$

j=cR+r
r=0, 1, ..., R−1
c=0, 1, ..., C−1
$C = \lceil N_{REG}^{CORESET}/(LR) \rceil$
where $R \in \{2, 3, 6\}$ is given by the higher-layer parameter CORESET-interleaver-size and where
  $n_{shift}$ is a function of $N_{ID}^{cell}$ for a PDCCH transmitted in a CORESET configured by the PBCH or RMSI $n_{shift} \in \{0, 1, \ldots, 274\}$ is a function of the higher-layer parameter CORESET-shift-index."

The above solution only works when $CR=N_{REG}^{CORESET}/L$, and fails when this condition is not true. For example, when $N_{RB}^{CORESET}=30$, $N_{symb}^{CORESET}=2$, there are $N_{REG}^{CORESET}=60$ REGs. With bundle size L=6, we have $N_{REG}^{CORESET}/L=10$ bundles. With CORESET-interleaver-size R=3, we have C=4. For j=8, we have c=2, r=2 which gives f(8)=10 mod 10=0 (assuming $n_{shift}=0$). This is invalid since f(0)=0 too, i.e., an element in the interleaving matrix is read more than once.

Another solution, for example from 3GPP TS 36.212, is to insert dummy entries in the interleaving matrix when writing to the matrix and to skip the dummy entries when reading from the matrix.

The bits input to the block interleaver are denoted by $d_0^{(i)}$, $d_1^{(i)}$, $d_2^{(i)}$, ..., $d_{D-1}^{(i)}$, where D is the number of bits. The output bit sequence from the block interleaver is derived as follows:

(1) Assign $C_{subblock}^{TC}=32$ to be the number of columns of the matrix. The columns of the matrix are numbered 0, 1, 2, ..., $C_{subblock}^{TC}-1$ from left to right.

(2) Determine the number of rows of the matrix $R_{subblock}^{TC}$, by finding minimum integer $R_{subblock}^{TC}$ such that:

$$D \leq (R_{subblock}^{TC} \times C_{subblock}^{TC})$$

The rows of the rectangular matrix are numbered 0, 1, 2, ..., $R_{subblock}^{TC}-1$ from top to bottom.

(3) If $(R_{subblock}^{TC} \times C_{subblock}^{TC}) > D$, then ND= $(R_{subblock}^{TC} \times C_{subblock}^{TC} - D)$ dummy bits are padded such that yk=<NULL> for k=0, 1, ..., ND-1. Then, $y_{N_D+k} = d_k^{(i)}$, k=0, 1, ..., D-1, and the bit sequence yk is written into the $(R_{subblock}^{TC} \times C_{subblock}^{TC})$ matrix row by row starting with bit y0 in column 0 of row 0:

$$\begin{bmatrix} y_0 & y_1 & y_2 & \cdots & y_{C_{subblock}^{TC}-1} \\ y_{C_{subblock}^{TC}} & y_{C_{subblock}^{TC}+1} & y_{C_{subblock}^{TC}+2} & \cdots & y_{2C_{subblock}^{TC}-1} \\ \vdots & \vdots & \vdots & \ddots & \vdots \\ y_{(R_{subblock}^{TC}-1) \times C_{subblock}^{TC}} & y_{(R_{subblock}^{TC}-1) \times C_{subblock}^{TC}+1} & y_{(R_{subblock}^{TC}-1) \times C_{subblock}^{TC}+2} & \cdots & y_{(R_{subblock}^{TC} \times C_{subblock}^{TC}-1)} \end{bmatrix}$$

For $d_k^{(0)}$ and $d_k^{(1)}$:

(4) Perform the inter-column permutation for the matrix based on the pattern $\langle P(j) \rangle j \in \{0, 1, \ldots, C_{subblock}^{TC}-1\}$ that is shown in 3rd Generation Partnership Project (3GPP) Technical Specification (TS) 36.212 table 5.1.4-1, where P(j) is the original column position of the j-th permuted column. After permutation of the columns, the inter-column permuted $(R_{subblock}^{TC} \times C_{subblock}^{TC})$ matrix is equal to (5) The output of the block interleaver is the bit sequence read out column by column from the inter-column permuted $(R_{subblock}^{TC} \times C_{subblock}^{TC})$ matrix. The bits after sub-block interleaving are denoted by $v_0^{(i)}, v_1^{(i)}, v_2^{(i)}, \ldots, v_{K_\pi-1}^{(i)}$, where $v_0^{(i)}$ corresponds to $y_{P(0)}$, $v_1^{(i)}$ to $y_{P(0)+C_{subblock}^{TC}}$ ... and $k_\pi = (R_{subblock}^{TC} \times C_{subblock}^{TC})$."

With this solution, the dummy entries should be skipped when reading out from the interleaver matrix. This is not efficient from an implementation perspective compared to methods that directly generate the interleaving sequences.

SUMMARY

Some embodiments advantageously provide methods, systems, and apparatuses for efficient block interleaving as compared with known solutions are disclosed. According to one aspect, a network node is configured to generate an interleaver sequence for a control resource set, CORESET, configuration for a physical downlink control channel, the interleaving sequence having an input sequence and at least one null entry.

According to a first aspect of the present disclosure, a network node configured to communicate with a wireless device, WD, is provided. The network node is configured to, and/or comprises a radio interface and/or comprises processing circuitry configured to generate an interleaver sequence for a control resource set, CORESET, configuration for a physical downlink control channel, the interleaver sequence associated with an interleaving matrix; optionally, for each one of an allowed value of number of rows for the interleaving matrix, determine a number of null entries to be added to the interleaving matrix; and select a number of rows, R, for the interleaving matrix such that the number of null entries to be added to the interleaving matrix is: no more than a number of columns, C, of the interleaving matrix; and optionally, the smallest among the numbers of null entries determined for each of the allowed values of number of rows for the interleaving matrix.

In some embodiments of this aspect, the number of null entries is no more than a width of the interleaver matrix, the interleaver matrix including the interleaver sequence. In some embodiments of this aspect, the generation of the interleaver sequence includes computing:

$$\begin{bmatrix} y_{P(0)} & y_{P(1)} & y_{P(2)} & \cdots & y_{P(C_{subblock}^{TC}-1)} \\ y_{P(0)+C_{subblock}^{TC}} & y_{P(1)+C_{subblock}^{TC}} & y_{P(2)+C_{subblock}^{TC}} & \cdots & y_{P(C_{subblock}^{TC}-1)+C_{subblock}^{TC}} \\ \vdots & \vdots & \vdots & \ddots & \vdots \\ y_{P(0)+(R_{subblock}^{TC}-1) \times C_{subblock}^{TC}} & y_{P(1)+(R_{subblock}^{TC}-1) \times C_{subblock}^{TC}} & y_{P(2)+(R_{subblock}^{TC}-1) \times C_{subblock}^{TC}} & \cdots & y_{P(C_{subblock}^{TC}-1)+(R_{subblock}^{TC}-1) \times C_{subblock}^{TC}} \end{bmatrix}$$

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L - 1$, and $N_{REG}^{CORESET}$ is a number of resource element groups, REGs, in the CORESET and L is a REG bundle size. In some embodiments of this aspect, the generation of the interleaver sequence includes computing:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments of this aspect, the generation of the interleaver sequence includes computing:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L - 1$, and $N_{REG}^{CORESET}$ is a number of resource element groups REGs in the CORESET and L is a REG bundle size. In some embodiments of this aspect, the generation of the interleaver sequence includes computing:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th}-1, \text{ and } r = 0, 1, \ldots, \bar{r}-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \text{ and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments of this aspect, the network node is further configured to: write the interleaver sequence row-wise as entries into a table with R rows and C columns; read the entries of the table column-wise; and skip the null entries in the read entries to obtain a final interleaved sequence.

According to a second aspect, a method for a network node configured to communicate with a wireless device, WD, is provided. The method includes generating an interleaver sequence for a control resource set, CORESET, configuration for a physical downlink control channel, the interleaver sequence associated with an interleaving matrix; optionally, for each one of an allowed value of number of rows for the interleaving matrix, determining a number of null entries to be added to the interleaving matrix; and selecting (a number of rows, R, for the interleaving matrix such that the number of null entries to be added to the interleaving matrix is: no more than a number of columns, C, of the interleaving matrix; and optionally, the smallest among the numbers of null entries determined for each of the allowed values of number of rows for the interleaving matrix.

In some embodiments of this aspect, the number of null entries is no more than a width of the interleaver matrix, the interleaver matrix including the interleaver sequence. In some embodiments of this aspect, the generating the interleaver sequence includes computing:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L - 1$, and $N_{REG}^{CORESET}$ is a number of resource element groups, REGs, in the CORESET and L is a REG bundle size. In some embodiments of this aspect, the generating the interleaver sequence includes computing:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, D-1, \text{ and } r = 0, 1 \ldots, R-1 \\ cR + r - c + C - D & \text{if } c = C - D, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the generating the interleaver sequence includes computing:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the generating the interleaver sequence includes computing:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th}-1, \text{ and } r = \underline{r}+1, \ldots, R-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the method further includes writing the interleaver sequence row-wise as entries into a table with R rows and C columns; reading the entries of the table column-wise; and skipping the null entries in the read entries to obtain a final interleaved sequence.

According to a third aspect, a wireless device, WD, configured to communicate with a network node is provided. The WD is configured to, and/or comprising a radio interface and/or processing circuitry configured to decompose an interleaver sequence for a control resource set, CORESET, configuration for a physical downlink control channel, the interleaver sequence associated with an interleaving matrix, the interleaving matrix having a number of rows, R, selected such that a number of null entries to be added to the interleaving matrix is: no more than a number of columns, C, of the interleaving matrix; and optionally, the smallest among numbers of null entries determined for each of an allowed value of number of rows for the interleaving matrix.

In some embodiments of this aspect, the number of null entries is no more than a width of the interleaver matrix, the interleaver matrix including the interleaver sequence. In some embodiments of this aspect, the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L-1$, and $N_{REG}^{CORESET}$ is a number of resource element groups, REGs, in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C - D, \ldots, C-1, \text{ and } r = 0, 1 \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}+1, \ldots, R-1 \end{cases}$$

$$C = \lceil N_{REG}^{CORESET}/(LR) \rceil$$

$$D = CR - N_{REG}^{CORESET}/L$$

$$r = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th}-1, \\ & \text{and } r = 0, 1, \ldots, \bar{r}-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \\ & \text{and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the WD is further configured to write the interleaver sequence row-wise as entries into a table with R rows and C columns; read the entries of the table column-wise; and skip the null entries in the read entries to obtain a final interleaved sequence.

According to a fourth aspect, a method for a wireless device, WD, configured to communicate with a network node is provided. The method includes decomposing an interleaver sequence for a control resource set, CORESET, configuration for a physical downlink control channel, the interleaver sequence associated with an interleaving matrix, the interleaving matrix having a number of rows, R, selected such that a number of null entries to be added to the interleaving matrix is: no more than a number of columns, C, of the interleaving matrix; and optionally, the smallest among numbers of null entries determined for each of an allowed value of number of rows for the interleaving matrix.

In some embodiments of this aspect, the number of null entries is no more than a width of the interleaver matrix, the interleaver matrix including the interleaver sequence. In some embodiments of this aspect, the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L-1$, and $N_{REG}^{CORESET}$ is a number of resource element groups, REGs, in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1, \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{\downarrow h} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the interleaver sequence is decomposed according to:

$$f(j) = g((j + n_{shift}) \bmod (N_{REG}^{CORESET}/L))$$

$$g(k) = rC + c$$

-continued $$k = \begin{cases} cR + r - \lfloor \frac{D}{C} \rfloor c & \text{if } c = 0, 1, \ldots, c_{th} - 1, \\ & \text{and } r = 0, 1, \ldots, \bar{r} - 1 \\ cR + r - \lfloor \frac{D}{C} \rfloor c_{th} - (c - c_{th})(\lfloor \frac{D}{C} \rfloor + 1) & \text{if } c = c_{th}, \ldots, C - 1, \\ & \text{and } r = 0, 1, \ldots, \bar{r} - 2 \end{cases}$$

$$C = \lceil N_{REG}^{CORESET} / (LR) \rceil$$

$$D = CR - N_{REG}^{CORESET} / L$$

$$\bar{r} = R - \lfloor \frac{D}{C} \rfloor$$

$$c_{th} = \lceil \frac{D}{C} \rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments of this aspect, the method further includes writing the interleaver sequence row-wise as entries into a table with R rows and C columns; reading the entries of the table column-wise; and skipping the null entries in the read entries to obtain a final interleaved sequence.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein:

FIG. 7 is a block diagram of an alternative embodiment of a host computer according to some embodiments of the present disclosure;
FIG. 8 is a block diagram of an alternative embodiment of a network node according to some embodiments of the present disclosure;
FIG. 9 is a block diagram of an alternative embodiment of a wireless device according to some embodiments of the present disclosure;
FIG. 17 is an illustration of an alternative embodiment of an interleaver matrix in table form.

DETAILED DESCRIPTION

Figure 1:
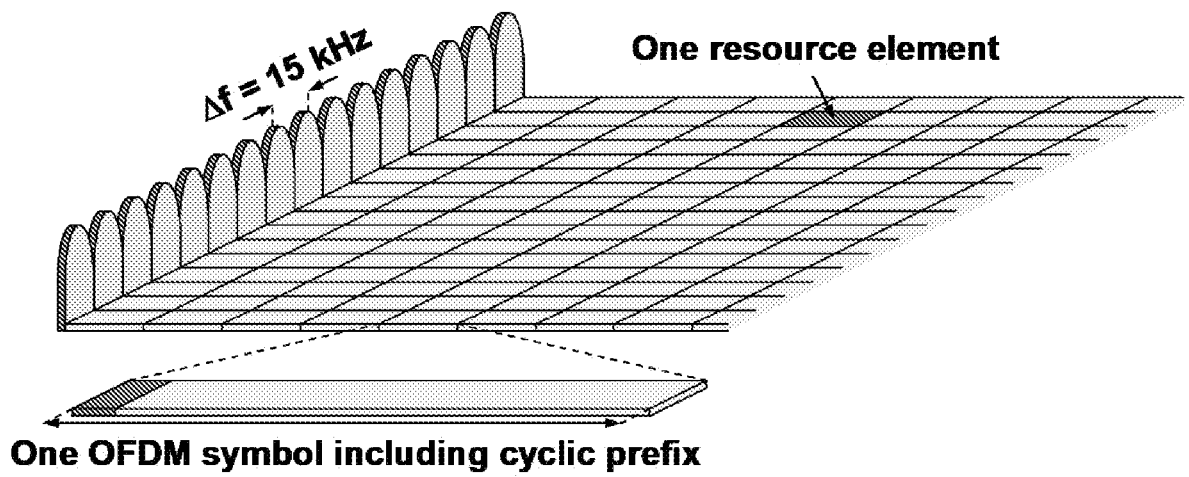
FIG. 1 is time frequency grid.

Before describing in detail exemplary embodiments, it is noted that the embodiments reside primarily in combinations of apparatus components and processing steps related to efficient block interleaving. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein. Like numbers refer to like elements throughout the description.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

The term "network node" used herein can be any kind of network node comprised in a radio network which may further comprise any of base station (BS), radio base station, base transceiver station (BTS), base station controller (BSC), radio network controller (RNC), g Node B (gNB), evolved Node B (eNB or eNodeB), Node B, multi-standard radio (MSR) radio node such as MSR BS, multi-cell/multicast coordination entity (MCE), relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a wireless device (WD) or a radio network node.

In some embodiments, the non-limiting terms wireless device (WD) or a user equipment (UE) are used interchangeably. The WD herein can be any type of wireless device capable of communicating with a network node or another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IoT) device, or a Narrowband IoT (NB-IOT) device etc.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), relay node, access point, radio access point, Remote Radio Unit (RRU) Remote Radio Head (RRH).

Note that although terminology from one particular wireless system, such as, for example, 3GPP LTE, may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Note further, that functions described herein as being performed by a wireless device or a network node may be distributed over a plurality of wireless devices and/or network nodes. In other words, it is contemplated that the functions of the network node and wireless device described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments provide a block interleaver with dummy entries for interleaving operations in NR CCE-REG mapping, which reduces computational complexity. The teaching herein introduces efficient methods for a block interleaver with dummy entries for interleaving operations in NR CCE-to-REG mapping. However, the solutions presented in the embodiments here are applicable to other contexts where block interleavers are used. According to one aspect a network node is configured to generate an interleaver sequence for a control resource set, CORESET, configuration for a physical downlink control channel, the interleaving sequence having an input sequence and at least one null entry.

Figure 5:
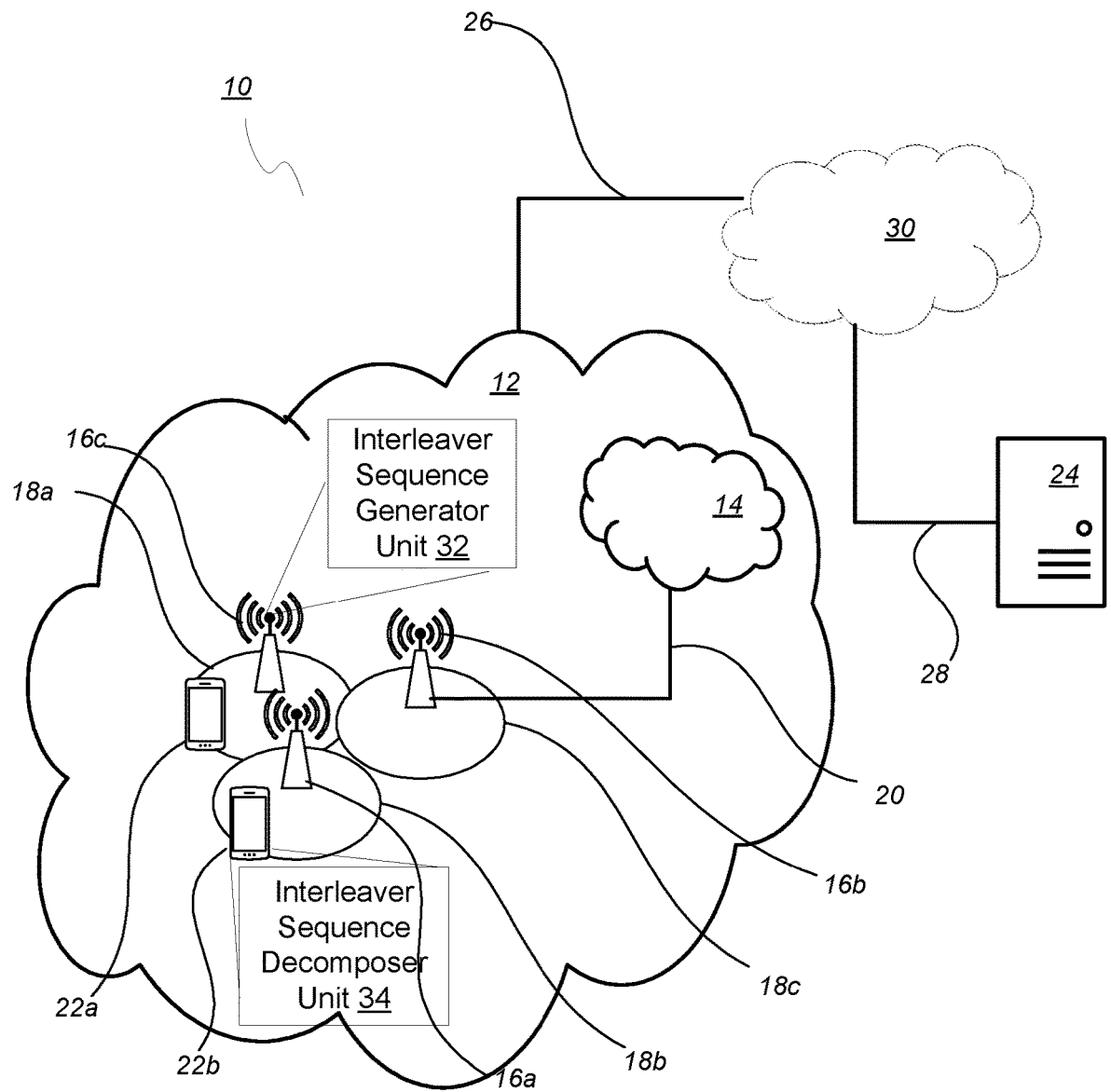
FIG. 5 is a schematic diagram of an exemplary network architecture illustrating a communication system connected via an intermediate network to a host computer according to the principles in the present disclosure.

Returning to the drawing figures, in which like elements are referred to by like reference numerals, there is shown in FIG. 5 a schematic diagram of a communication system, according to an embodiment, including a communication system 10, such as a 3GPP-type cellular network, which comprises an access network 12, such as a radio access network, and a core network 14. The access network 12 comprises a plurality of network nodes 16a, 16b, 16c (referred to collectively as network nodes 16), such as NBs, eNBs, gNBs or other types of wireless access points, each defining a corresponding coverage area 18a, 18b, 18c (referred to collectively as coverage areas 18). Each network node 16a, 16b, 16c is connectable to the core network 14 over a wired or wireless connection 20. A first wireless device (WD) 22a located in coverage area 18a is configured to wirelessly connect to, or be paged by, the corresponding network node 16c. A second WD 22b in coverage area 18b is wirelessly connectable to the corresponding network node 16a. While a plurality of WDs 22a, 22b (collectively referred to as wireless devices 22) are illustrated in this example, the disclosed embodiments are equally applicable to a situation where a sole WD is in the coverage area or where a sole WD is connecting to the corresponding network node 16. Note that although only two WDs 22 and three network nodes 16 are shown for convenience, the communication system may include many more WDs 22 and network nodes 16.

The communication system 10 may itself be connected to a host computer 24, which may be embodied in the hardware and/or software of a standalone server, a cloud-implemented server, a distributed server or as processing resources in a server farm. The host computer 24 may be under the ownership or control of a service provider, or may be operated by the service provider or on behalf of the service provider. The connections 26, 28 between the communication system 10 and the host computer 24 may extend directly from the core network 14 to the host computer 24 or may extend via an optional intermediate network 30. The intermediate network 30 may be one of, or a combination of more than one of, a public, private or hosted network. The intermediate network 30, if any, may be a backbone network or the Internet. In some embodiments, the intermediate network 30 may comprise two or more sub-networks (not shown).

The communication system of FIG. 5 as a whole enables connectivity between one of the connected WDs 22a, 22b and the host computer 24. The connectivity may be described as an over-the-top (OTT) connection. The host computer 24 and the connected WDs 22a, 22b are configured to communicate data and/or signaling via the OTT connection, using the access network 12, the core network 14, any intermediate network 30 and possible further infrastructure (not shown) as intermediaries. The OTT connection may be transparent in the sense that at least some of the participating communication devices through which the OTT connection passes are unaware of routing of uplink and downlink communications. For example, a network node 16 may not or need not be informed about the past routing of an incoming downlink communication with data originating from a host computer 24 to be forwarded (e.g., handed over) to a connected WD 22a. Similarly, the network node 16 need not be aware of the future routing of an outgoing uplink communication originating from the WD 22a towards the host computer 24.

A network node 16 is configured to include an interleaver sequence generator unit 32 which is configured to generate an interleaver sequence for a control resource set, CORESET, configuration for a physical downlink control channel, the interleaver sequence associated with an interleaving matrix. The interleaver sequence generator unit 32 is optionally configured to, for each one of an allowed value of number of rows for the interleaving matrix, determine a number of null entries to be added to the interleaving matrix. The interleaver sequence generator unit 32 is configured to select a number of rows, R, for the interleaving matrix such that the number of null entries to be added to the interleaving matrix is: no more than a number of columns, C, of the interleaving matrix; and optionally, the smallest among the numbers of null entries determined for each of the allowed values of number of rows for the interleaving matrix. In some embodiments, the interleaver sequence generator unit 32 is configured to generate an interleaver sequence for a control resource set, CORESET, configuration for a physical downlink control channel, the interleaving sequence having an input sequence and at least one null entry.

A wireless device 22 is configured to include an interleaver sequence decomposer unit 34 that is configured to decompose an interleaver sequence for a control resource set, CORESET, configuration for a physical downlink control channel, the interleaver sequence associated with an interleaving matrix, the interleaving matrix having a number of rows, R, selected such that a number of null entries to be added to the interleaving matrix is: no more than a number of columns, C, of the interleaving matrix; and optionally, the smallest among numbers of null entries determined for each of an allowed value of number of rows for the interleaving matrix. In some embodiments, the interleaver sequence decomposer unit 34 is configured to decompose an interleaver sequence for a control resource set, CORESET, configuration for a physical downlink control channel, the interleaving sequence having an input sequence and at least one null entry.

Example implementations, in accordance with an embodiment, of the WD 22, network node 16 and host computer 24 discussed in the preceding paragraphs will now be described with reference to FIG. 6. In a communication system 10, a host computer 24 comprises hardware (HW) 38 including a communication interface 40 configured to set up and maintain a wired or wireless connection with an interface of a different communication device of the communication system 10. The host computer 24 further comprises processing circuitry 42, which may have storage and/or processing capabilities. The processing circuitry 42 may include a processor 44 and memory 46. In particular, in addition to a traditional processor and memory, the processing circuitry 42 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 44 may be configured to access (e.g., write to and/or read from) memory 46, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Processing circuitry 42 may be configured to control any of the methods and/or processes described herein and/or to cause such methods, and/or processes to be performed, e.g., by host computer 24. Processor 44 corresponds to one or more processors 44 for performing host computer 24 functions described herein. The host computer 24 includes memory 46 that is configured to store data, programmatic software code and/or other information described herein. In some embodiments, the software 48 and/or the host application 50 may include instructions that, when executed by the processor 44 and/or processing circuitry 42, causes the processor 44 and/or processing circuitry 42 to perform the processes described herein with respect to host computer 24. The instructions may be software associated with the host computer 24.

The software 48 may be executable by the processing circuitry 42. The software 48 includes a host application 50. The host application 50 may be operable to provide a service to a remote user, such as a WD 22 connecting via an OTT connection 52 terminating at the WD 22 and the host computer 24. In providing the service to the remote user, the host application 50 may provide user data which is transmitted using the OTT connection 52. The "user data" may be data and information described herein as implementing the described functionality. In one embodiment, the host computer 24 may be configured for providing control and functionality to a service provider and may be operated by the service provider or on behalf of the service provider. The processing circuitry 42 of the host computer 24 may enable the host computer 24 to observe, monitor, control, transmit to and/or receive from the network node 16 and or the wireless device 22.

The communication system 10 further includes a network node 16 provided in a communication system 10 and comprising hardware 58 enabling it to communicate with the host computer 24 and with the WD 22. The hardware 58 may include a communication interface 60 for setting up and maintaining a wired or wireless connection with an interface of a different communication device of the communication system 10, as well as a radio interface 62 for setting up and maintaining at least a wireless connection 64 with a WD 22 located in a coverage area 18 served by the network node 16. The radio interface 62 may be formed as or may include, for example, one or more RF transmitters, one or more RF receivers, and/or one or more RF transceivers. The communication interface 60 may be configured to facilitate a connection 66 to the host computer 24. The connection 66 may be direct or it may pass through a core network 14 of the communication system 10 and/or through one or more intermediate networks 30 outside the communication system 10.

In the embodiment shown, the hardware 58 of the network node 16 further includes processing circuitry 68. The processing circuitry 68 may include a processor 70 and a memory 72. In particular, in addition to a traditional processor and memory, the processing circuitry 68 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 70 may be configured to access (e.g., write to and/or read from) the memory 72, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the network node 16 further has software 74 stored internally in, for example, memory 72, or stored in external memory (e.g., database) accessible by the network node 16 via an external connection. The software 74 may be executable by the processing circuitry 68. The processing circuitry 68 may be configured to control any of the methods and/or processes described herein and/or to cause such methods, and/or processes to be performed, e.g., by network node 16. Processor 70 corresponds to one or more processors 70 for performing network node 16 functions described herein. The memory 72 is configured to store data, programmatic software code and/or other information described herein. In some embodiments, the software 74 may include instructions that, when executed by the processor 70 and/or processing circuitry 68, causes the processor 70 and/or processing circuitry 68 to perform the processes described herein with respect to network node 16. For example, processing circuitry 68 of the network node 16 may include an interleaver sequence generator unit 32 configured to generate an interleaver sequence for a control resource set, CORESET, configuration for a physical downlink control channel, the interleaver sequence associated with an interleaving matrix. The interleaver sequence generator unit 32 is, optionally, configured to for each one of an allowed value of number of rows for the interleaving matrix, determine a number of null entries to be added to the interleaving matrix. The interleaver sequence generator unit 32 is configured to select a number of rows, R, for the interleaving matrix such that the number of null entries to be added to the interleaving matrix is: no more than a number of columns, C, of the interleaving matrix; and optionally, the smallest among the numbers of null entries determined for each of the allowed values of number of rows for the interleaving matrix.

In some embodiments, the number of null entries is no more than a width of the interleaver matrix, the interleaver matrix including the interleaver sequence. In some embodiments, the generation of the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2, \ldots, R-1 \\ cR + r - D & \text{if } c = D, D+1, \ldots, C-1, \text{ and } r = 0, 1, \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L - 1$, and $N_{REG}^{CORESET}$ is a number of resource element groups, REGs, in the CORESET and L is a REG bundle size. In some embodiments, the generation of the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1, \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments, the generation of the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{\downarrow h} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L - 1$, and $N_{REG}^{CORESET}$ is a number of resource element groups REGs in the CORESET and L is a REG bundle size. In some embodiments, the generation of the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th}-1, \text{ and } r = 0, 1, \ldots, \bar{r}-1 \\ cR + r - \left\lfloor \frac{D}{C} \right\rfloor c_{\downarrow h} - (c - c_{\downarrow h})\left(\left\lfloor \frac{D}{C} \right\rfloor + 1\right) & \text{if } c = c_{th}, \ldots, C-1, \text{ and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments, the network node 16 is further configured to, such as via interleaver sequence generator unit 32 and/or processing circuitry 68, write the interleaver sequence row-wise as entries into a table with R rows and C columns; read the entries of the table column-wise; and skip the null entries in the read entries to obtain a final interleaved sequence.

In some embodiments, the interleaver sequence generator unit 32 is configured to generate an interleaver sequence for a control resource set, CORESET, configuration for a physical downlink control channel, the interleaving sequence having an input sequence and at least one null entry.

The communication system 10 further includes the WD 22 already referred to. The WD 22 may have hardware 80 that may include a radio interface 82 configured to set up and maintain a wireless connection 64 with a network node 16 serving a coverage area 18 in which the WD 22 is currently located. The radio interface 82 may be formed as or may include, for example, one or more RF transmitters, one or more RF receivers, and/or one or more RF transceivers.

The hardware 80 of the WD 22 further includes processing circuitry 84. The processing circuitry 84 may include a processor 86 and memory 88. In particular, in addition to a traditional processor and memory, the processing circuitry 84 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 86 may be configured to access (e.g., write to and/or read from) memory 88, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the WD 22 may further comprise software 90, which is stored in, for example, memory 88 at the WD 22, or stored in external memory (e.g., database) accessible by the WD 22. The software 90 may be executable by the processing circuitry 84. The software 90 may include a client application 92. The client application 92 may be operable to provide a service to a human or non-human user via the WD 22, with the support of the host computer 24. In the host computer 24, an executing host application 50 may communicate with the executing client application 92 via the OTT connection 52 terminating at the WD 22 and the host computer 24. In providing the service to the user, the client application 92 may receive request data from the host application 50 and provide user data in response to the request data. The OTT connection 52 may transfer both the request data and the user data. The client application 92 may interact with the user to generate the user data that it provides.

The processing circuitry 84 may be configured to control any of the methods and/or processes described herein and/or to cause such methods, and/or processes to be performed, e.g., by WD 22. The processor 86 corresponds to one or more processors 86 for performing WD 22 functions described herein. The WD 22 includes memory 88 that is configured to store data, programmatic software code and/or other information described herein. In some embodiments, the software 90 and/or the client application 92 may include instructions that, when executed by the processor 86 and/or processing circuitry 84, causes the processor 86 and/or processing circuitry 84 to perform the processes described herein with respect to WD 22. For example, the processing circuitry 84 of the wireless device 22 may include an interleaver sequence decomposer unit 34 configured to decompose an interleaver sequence for a control resource set, CORESET, configuration for a physical downlink control channel, the interleaver sequence associated with an interleaving matrix. The interleaving matrix has a number of rows, R, selected such that a number of null entries to be added to the interleaving matrix is: no more than a number of columns, C, of the interleaving matrix; and optionally, the smallest among numbers of null entries determined for each of an allowed value of number of rows for the interleaving matrix.

In some embodiments, the number of null entries is no more than a width of the interleaver matrix, the interleaver matrix including the interleaver sequence. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L-1$, and $N_{REG}^{CORESET}$ is a number of resource element groups, REGs, in the CORESET and L is a REG bundle size. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c - D$$

$$k =$$

$$\begin{cases} cR + r - (\underline{r} + 1)(c + 1) & \text{if } c = 0, 1, \ldots, c_{th} - 1, \text{ and } r = \underline{r} + 1, \ldots, R-1 \\ cR + r - c_{\downarrow h} - \underline{r}(c + 1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \lfloor \frac{D}{C} \rfloor$$

$$c_{th} = D - \lfloor \frac{D}{C} \rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size. In some embodiments, the interleaver sequence is decomposed according to:

$$f(j) = g((j + n_{shift}) \bmod (N_{REG}^{CORESET}/L))$$

$$g(k) = rC + c$$

$$k = \begin{cases} cR + r - \left\lfloor \dfrac{D}{C} \right\rfloor c & \text{if } c = 0, 1, \ldots, c_{th} - 1, \\ & \text{and } r = 0, 1, \ldots, \bar{r} - 1 \\ cR + r - \left\lfloor \dfrac{D}{C} \right\rfloor c_{th} - (c - c_{\downarrow h})\left(\left\lfloor \dfrac{D}{C} \right\rfloor + 1\right) & \text{if } c = c_{th}, \ldots, C - 1, \\ & \text{and } r = 0, 1, \ldots, \bar{r} - 2 \end{cases}$$

$$C = \lceil N_{REG}^{CORESET}/(LR) \rceil$$

$$D = CR - N_{REG}^{CORESET}/L$$

$$r = R - \left\lfloor \dfrac{D}{C} \right\rfloor$$

$$c_{th} = \left\lceil \dfrac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size. In some embodiments, the WD 22 is further configured to, such as via interleaver sequence decomposer unit 34 and/or processing circuitry 84, write the interleaver sequence row-wise as entries into a table with R rows and C columns; read the entries of the table column-wise; and skip the null entries in the read entries to obtain a final interleaved sequence.

In some embodiments, the interleaver sequence decomposer unit 34 is configured to decompose an interleaver sequence for a control resource set, CORESET, configuration for a physical downlink control channel, the interleaving sequence having an input sequence and at least one null entry.

Figure 6:
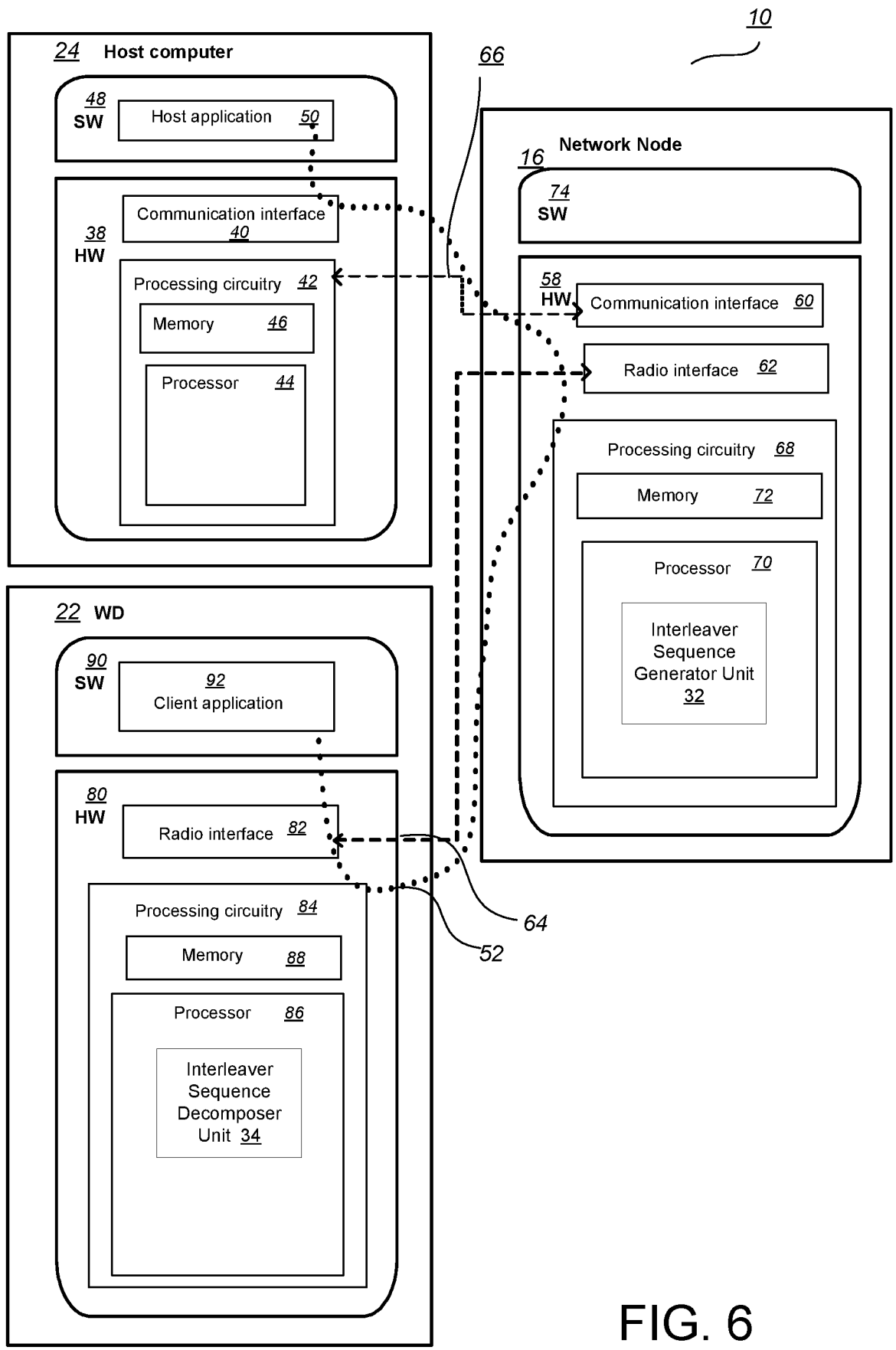
FIG. 6 is a block diagram of a host computer communicating via a network node with a wireless device over an at least partially wireless connection according to some embodiments of the present disclosure.

In some embodiments, the inner workings of the network node 16, WD 22, and host computer 24 may be as shown in FIG. 6 and independently, the surrounding network topology may be that of FIG. 5.

In FIG. 6, the OTT connection 52 has been drawn abstractly to illustrate the communication between the host computer 24 and the wireless device 22 via the network node 16, without explicit reference to any intermediary devices and the precise routing of messages via these devices. Network infrastructure may determine the routing, which it may be configured to hide from the WD 22 or from the service provider operating the host computer 24, or both. While the OTT connection 52 is active, the network infrastructure may further take decisions by which it dynamically changes the routing (e.g., on the basis of load balancing consideration or reconfiguration of the network).

The wireless connection 64 between the WD 22 and the network node 16 is in accordance with the teachings of the embodiments described throughout this disclosure. One or more of the various embodiments improve the performance of OTT services provided to the WD 22 using the OTT connection 52, in which the wireless connection 64 may form the last segment. More precisely, the teachings of some of these embodiments may improve the data rate, latency, and/or power consumption and thereby provide benefits such as reduced user waiting time, relaxed restriction on file size, better responsiveness, extended battery lifetime, etc.

In some embodiments, a measurement procedure may be provided for the purpose of monitoring data rate, latency and other factors on which the one or more embodiments improve. There may further be an optional network functionality for reconfiguring the OTT connection 52 between the host computer 24 and WD 22, in response to variations in the measurement results. The measurement procedure and/or the network functionality for reconfiguring the OTT connection 52 may be implemented in the software 48 of the host computer 24 or in the software 90 of the WD 22, or both. In embodiments, sensors (not shown) may be deployed in or in association with communication devices through which the OTT connection 52 passes; the sensors may participate in the measurement procedure by supplying values of the monitored quantities exemplified above, or supplying values of other physical quantities from which software 48, 90 may compute or estimate the monitored quantities. The reconfiguring of the OTT connection 52 may include message format, retransmission settings, preferred routing etc.; the reconfiguring need not affect the network node 16, and it may be unknown or imperceptible to the network node 16. Some such procedures and functionalities may be known and practiced in the art. In certain embodiments, measurements may involve proprietary WD signaling facilitating the host computer's 24 measurements of throughput, propagation times, latency and the like. In some embodiments, the measurements may be implemented in that the software 48, 90 causes messages to be transmitted, in particular empty or 'dummy' messages, using the OTT connection 52 while it monitors propagation times, errors etc.

Although FIGS. 5 and 6 show various "units" such as the interleaver sequence generator unit 32, and interleaver sequence decomposer unit 34 as being within a respective processor, it is contemplated that these units may be implemented such that a portion of the unit is stored in a corresponding memory within the processing circuitry. In other words, the units may be implemented in hardware or in a combination of hardware and software within the processing circuitry.

FIG. 7 is a block diagram of an alternative host computer 24, which may be implemented at least in part by software modules containing software executable by a processor to perform the functions described herein. The host computer 24 include a communication interface module 41 configured to set up and maintain a wired or wireless connection with an interface of a different communication device of the communication system 10. The memory module 47 is configured to store data, programmatic software code and/or other information described herein.

FIG. 8 is a block diagram of an alternative network node 16, which may be implemented at least in part by software modules containing software executable by a processor, to perform the functions described herein. The network node 16 includes a radio interface module 63 configured for setting up and maintaining at least a wireless connection 64 with a WD 22 located in a coverage area 18 served by the network node 16. The network node 16 also includes a communication interface module 61 configured for setting up and maintaining a wired or wireless connection with an interface of a different communication device of the communication system 10. The communication interface module 61 may also be configured to facilitate a connection 66 to the host computer 24. The memory module 73 that is configured to store data, programmatic software code and/or other information described herein. The interleaver sequence generator module 75 is configured to generate an interleaver sequence for a control resource set, CORESET, configuration for a physical downlink control channel, the interleaving sequence having an input sequence and at least one null entry.

FIG. 9 is a block diagram of an alternative wireless device 22, which may be implemented at least in part by software modules containing software executable by a processor to perform the functions described herein. The WD 22 includes a radio interface module 83 configured to set up and maintain a wireless connection 64 with a network node 16 serving a coverage area 18 in which the WD 22 is currently located. The memory module 89 is configured to store data, programmatic software code and/or other information described herein. The interleaver sequence decomposer module 91 is configured to decompose an interleaver sequence for a control resource set, CORESET, configuration for a physical downlink control channel, the interleaving sequence having an input sequence and at least one null entry.

Figure 2:
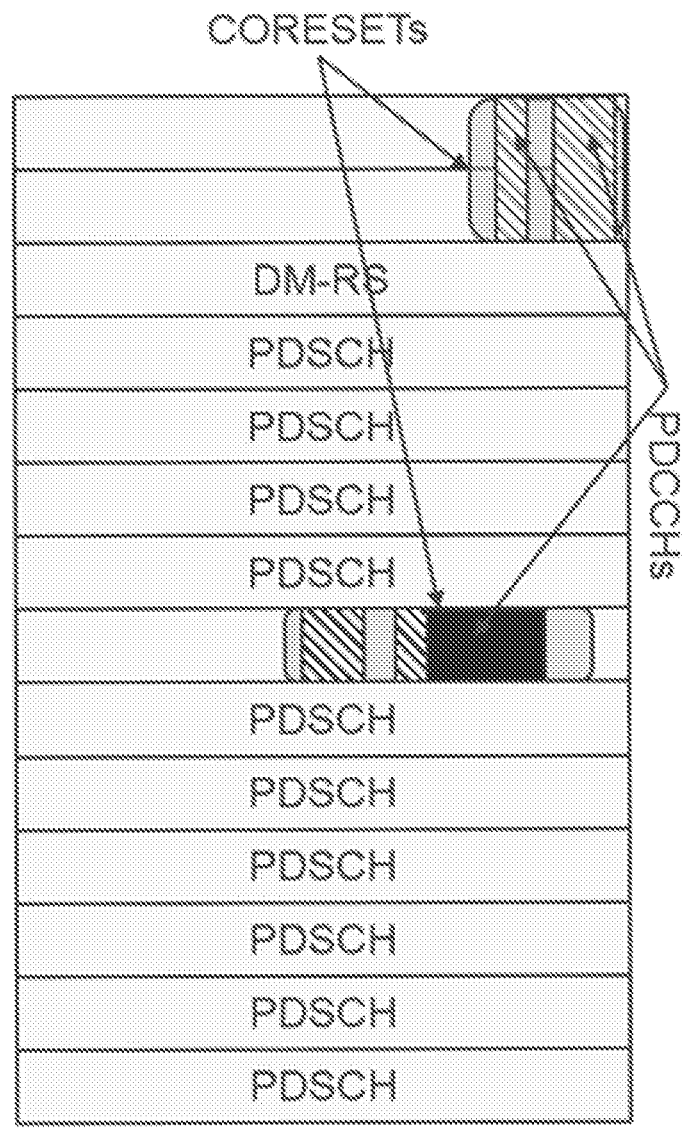
FIG. 2 is an illustration of CORESET configurations.
Figure 3:
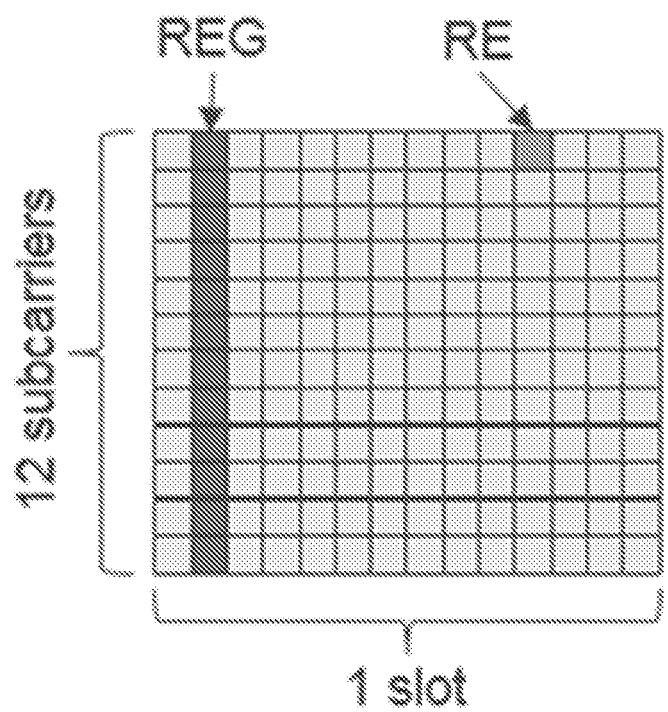
FIG. 3 is an illustration of REGs.
Figure 4:
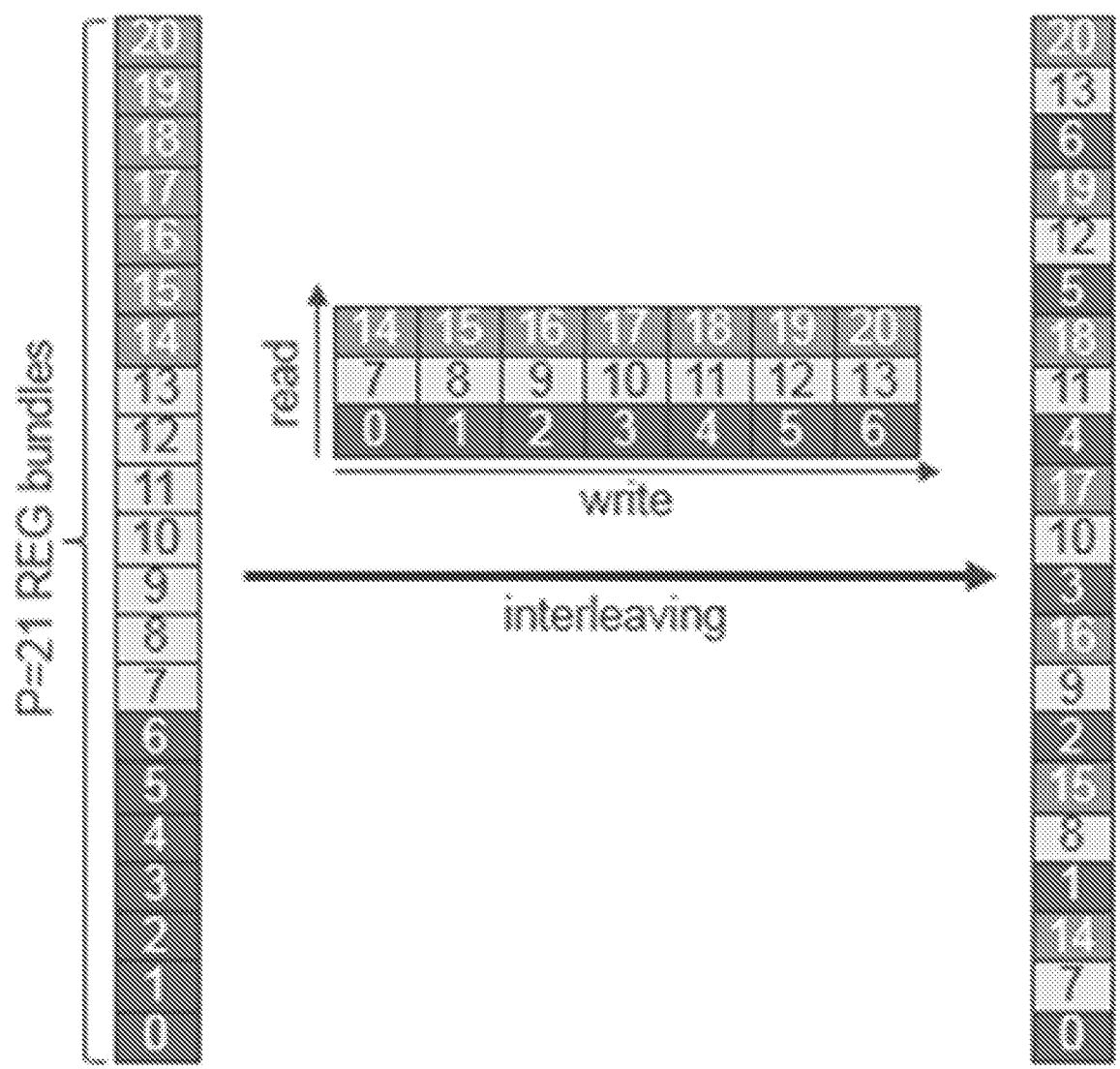
FIG. 4 is an illustration of interleaving.
Figures 10, 11:
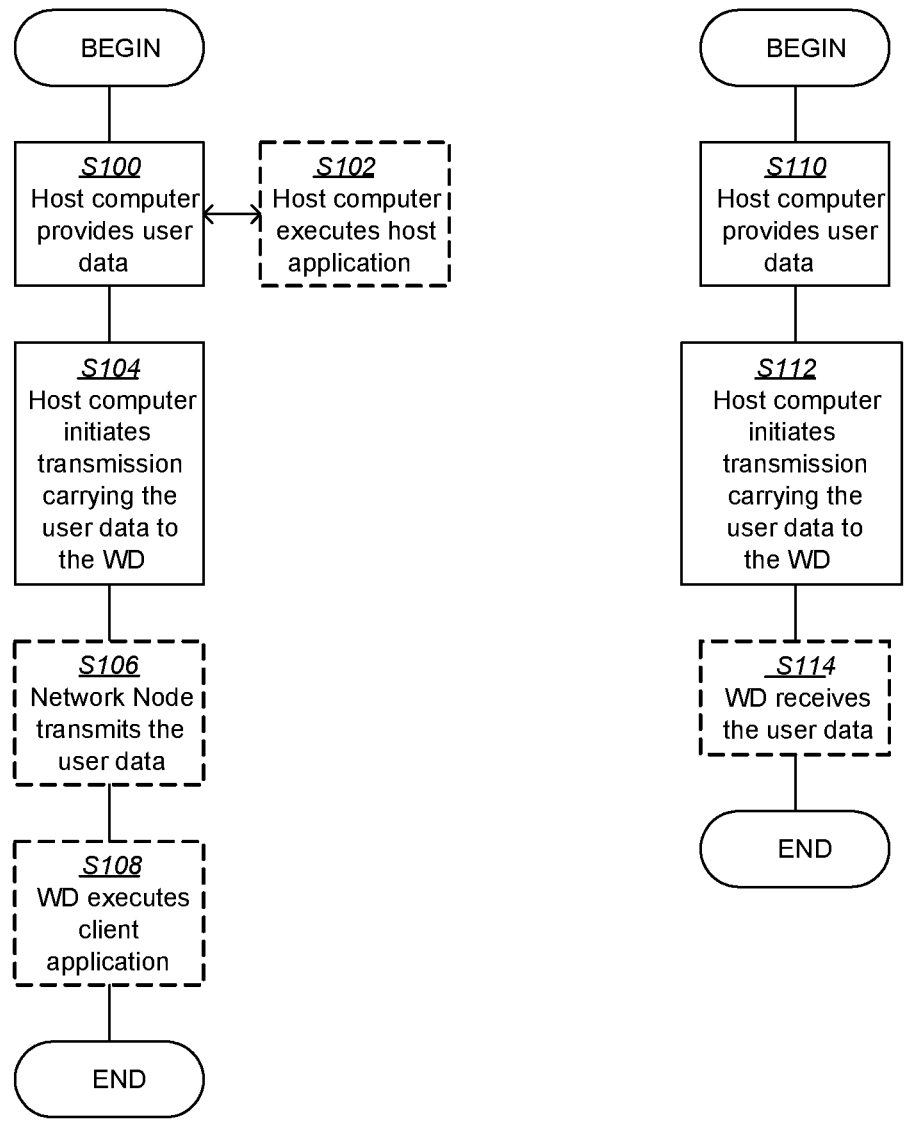
FIGS. 10-13 are flow charts illustrating exemplary methods implemented in a communication system including a host computer, a network node and a wireless device according to some embodiments of the present disclosure.

FIG. 10 is a flowchart illustrating an exemplary method implemented in a communication system, such as, for example, the communication system of FIGS. 1 and 2, in accordance with one embodiment. The communication system may include a host computer 24, a network node 16 and a WD 22, which may be those described with reference to FIG. 6. In a first step of the method, the host computer 24 provides user data (block S100). In an optional substep of the first step, the host computer 24 provides the user data by executing a host application, such as, for example, the software 74 (block S102). In a second step, the host computer 24 initiates a transmission carrying the user data to the WD 22 (block S104). In an optional third step, the network node 16 transmits to the WD 22 the user data which was carried in the transmission that the host computer 24 initiated, in accordance with the teachings of the embodiments described throughout this disclosure (block S106). In an optional fourth step, the WD 22 executes a client application, such as, for example, the client application 114, associated with the software 74 executed by the host computer 24 (block S108).

FIG. 11 is a flowchart illustrating an exemplary method implemented in a communication system, such as, for example, the communication system of FIG. 5, in accordance with one embodiment. The communication system may include a host computer 24, a network node 16 and a WD 22, which may be those described with reference to FIGS. 5 and 6. In a first step of the method, the host computer 24 provides user data (block S110). In an optional substep (not shown) the host computer 24 provides the user data by executing a host application, such as, for example, the software 74. In a second step, the host computer 24 initiates a transmission carrying the user data to the WD 22 (block S112). The transmission may pass via the network node 16, in accordance with the teachings of the embodiments described throughout this disclosure. In an optional third step, the WD 22 receives the user data carried in the transmission (block S114).

Figure 12:
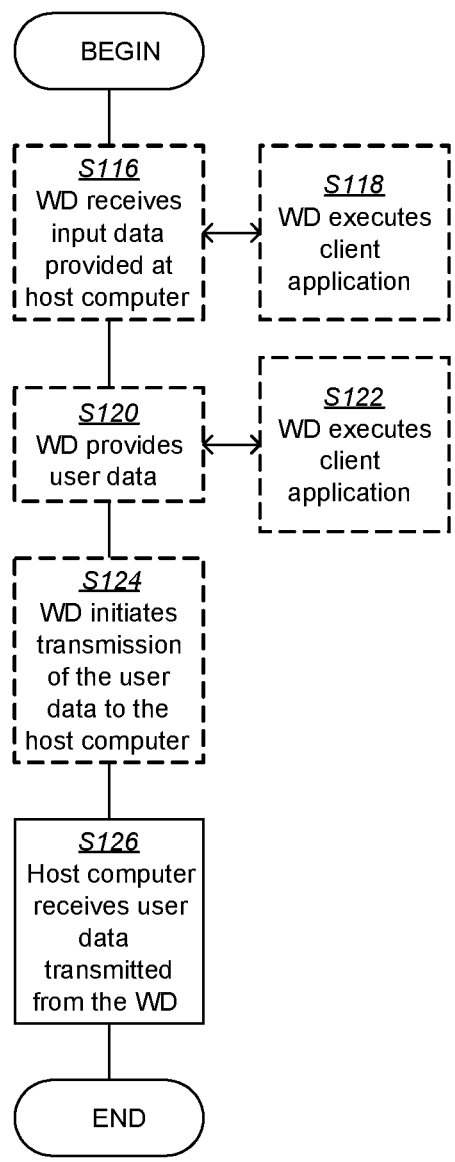

FIG. 12 is a flowchart illustrating an exemplary method implemented in a communication system, such as, for example, the communication system of FIG. 5, in accordance with one embodiment. The communication system may include a host computer 24, a network node 16 and a WD 22, which may be those described with reference to FIGS. 1 and 2. In an optional first step of the method, the WD 22 receives input data provided by the host computer 24 (block S116). In an optional substep of the first step, the WD 22 executes the client application 114, which provides the user data in reaction to the received input data provided by the host computer 24 (block SI 18). Additionally or alternatively, in an optional second step, the WD 22 provides user data (block S120). In an optional substep of the second step, the WD provides the user data by executing a client application, such as, for example, client application 114 (block S122). In providing the user data, the executed client application 114 may further consider user input received from the user. Regardless of the specific manner in which the user data was provided, the WD 22 may initiate, in an optional third substep, transmission of the user data to the host computer 24 (block S124). In a fourth step of the method, the host computer 24 receives the user data transmitted from the WD 22, in accordance with the teachings of the embodiments described throughout this disclosure (block S126).

Figure 13:
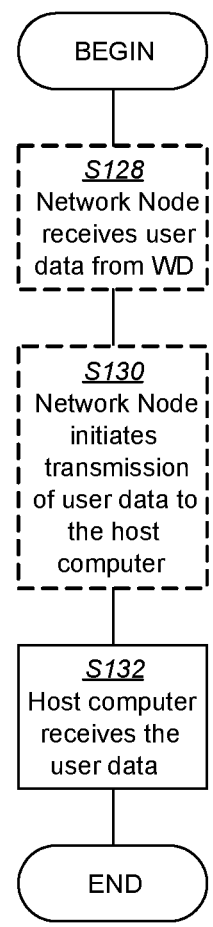

FIG. 13 is a flowchart illustrating an exemplary method implemented in a communication system, such as, for example, the communication system of FIG. 5, in accordance with one embodiment. The communication system may include a host computer 24, a network node 16 and a WD 22, which may be those described with reference to FIGS. 5 and 6. In an optional first step of the method, in accordance with the teachings of the embodiments described throughout this disclosure, the network node 16 receives user data from the WD 22 (block S128). In an optional second step, the network node 16 initiates transmission of the received user data to the host computer 24 (block S130). In a third step, the host computer 24 receives the user data carried in the transmission initiated by the network node 16 (block S132).

Figure 14:
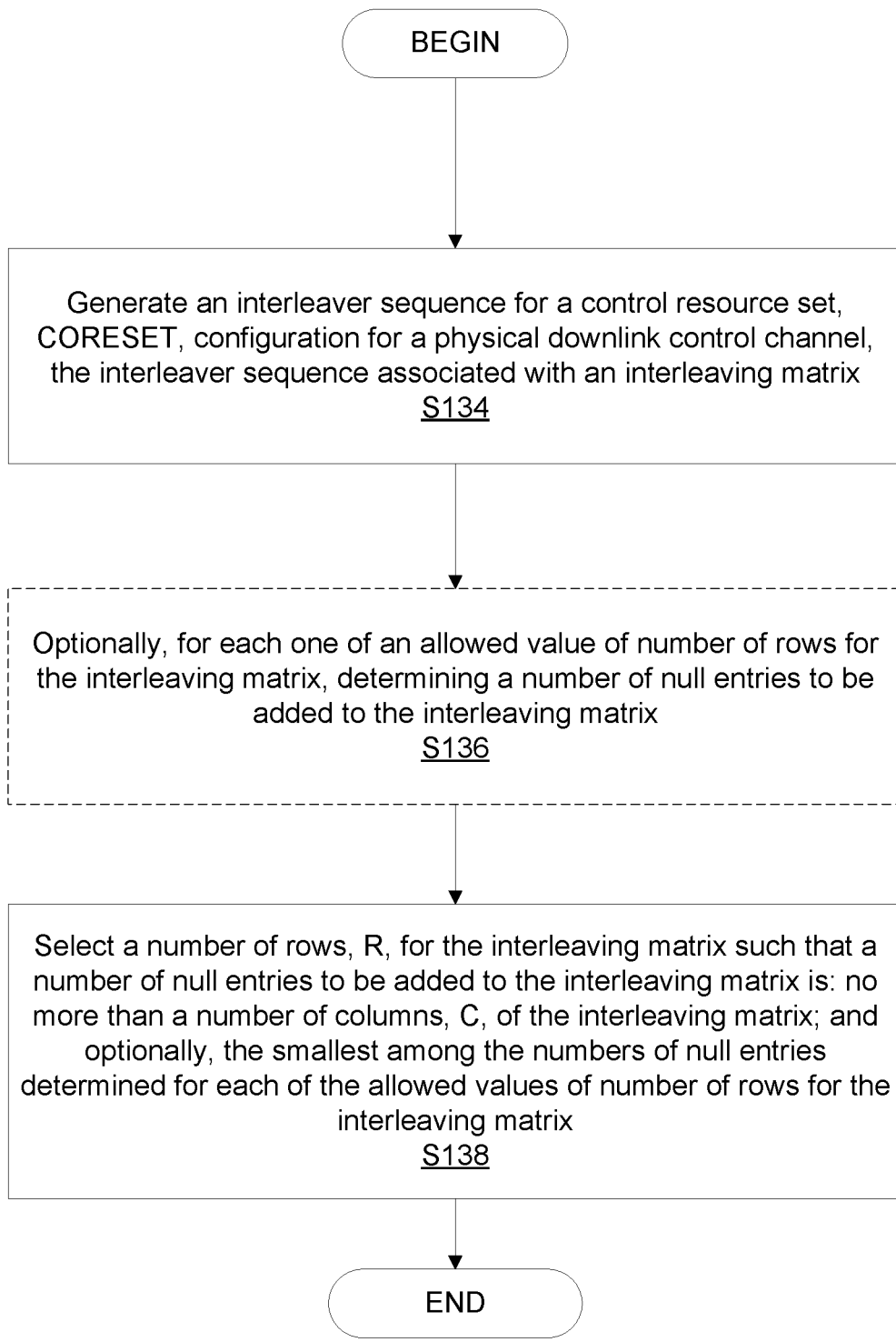
FIG. 14 is a flowchart of an exemplary process in a network node for generating an efficient interleaved block.

FIG. 14 is a flowchart of an exemplary process in a network node 16 for generating an interleaver sequence. The process includes generating (block S134), such as via interleaver sequence generator unit 32 and/or processing circuitry 68, an interleaver sequence for a control resource set, CORESET, configuration for a physical downlink control channel, the interleaver sequence associated with an interleaving matrix. The process optionally includes, for each one of an allowed value of number of rows for the interleaving matrix, determining (block S136), such as via interleaver sequence generator unit 32 and/or processing circuitry 68, a number of null entries to be added to the interleaving matrix. The process includes selecting (block S138), such as via interleaver sequence generator unit 32 and/or processing circuitry 68, a number of rows, R, for the interleaving matrix such that a number of null entries to be added to the interleaving matrix is: no more than a number of columns, C, of the interleaving matrix; and optionally, the smallest among the numbers of null entries determined for each of the allowed values of number of rows for the interleaving matrix.

In some embodiments, the number of null entries is no more than a width of the interleaver matrix, the interleaver matrix including the interleaver sequence. In some embodiments, the generating the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2, \ldots, R-1 \\ cR + r - D & \text{if } c = D, D+1, \ldots, C-1, \text{ and } r = 0, 1, \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence 0, . . . , $N_{REG}^{CORESET}/L - 1$, and $N_{REG}^{CORESET}$ is a number of resource element groups, REGs, in the CORESET and L is a REG bundle size. In some embodiments, the generating the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C - D - 1, \text{ and } r = 0, 1, \ldots, R - 1 \\ cR + r - c + C - D & \text{if } c = C - D, \ldots, C - 1, \text{ and } r = 0, 1 \ldots, R - 2 \end{cases}$$

$$C = \lceil N_{REG}^{CORESET}/(LR) \rceil$$

$$D = CR - N_{REG}^{CORESET}/L$$

where D equals the number of null entries added at an end of a sequence 0, ..., $N_{REG}^{CORESET}/L - 1$, and $N_{REG}^{CORESET}$ is a number of resource element groups REGs in the CORESET and L is a REG bundle size. In some embodiments, the generating the interleaver sequence includes computing, such as via interleaver sequence generator unit 32 and/or processing circuitry 68:

where D equals the number of null entries added at a beginning of a sequence 0, ..., $N_{REG}^{CORESET}/L - 1$, and $N_{REG}^{CORESET}$ is a number of resource element groups REGs in the CORESET and L is a REG bundle size. In some embodiments, the generating the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th} - 1, \text{ and } r = \underline{r} + 1, \ldots, R - 1 \\ cR + r - c_{th} - \underline{r}(c+1) & \text{if } c = 0, 1, \ldots, c_{th} - 1, \text{ and } r = \underline{r}, \ldots, R - 1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence 0, ..., $N_{REG}^{CORESET}/L - 1$, and $N_{REG}^{CORESET}$ is a number of resource element groups REGs in the CORESET and L is a REG bundle size. In some embodiments, the generating the interleaver sequence includes computing, such as via interleaver sequence generator unit 32 and/or processing circuitry 68:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th} - 1, \text{ and } r = 0, 1, \ldots, \bar{r} - 1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C - 1, \text{ and } r = 0, 1, \ldots, \bar{r} - 2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence 0, ..., $N_{REG}^{CORESET}/L - 1$, and $N_{REG}^{CORESET}$ is a number of resource element groups REGs in the CORESET and L is a REG bundle size. In some embodiments, the method further includes, such as via interleaver sequence generator unit 32 and/or processing circuitry 68, writing the interleaver sequence row-wise as entries into a table with R rows and C columns; reading the entries of the table column-wise; and skipping the null entries in the read entries to obtain a final interleaved sequence.

In some embodiments, the process includes generating, via the interleaver sequence generator unit 32, an interleaver sequence for a control resource set, CORESET, configuration for a physical downlink control channel, the interleaving sequence having an input sequence and at least one null entry.

Figure 15:
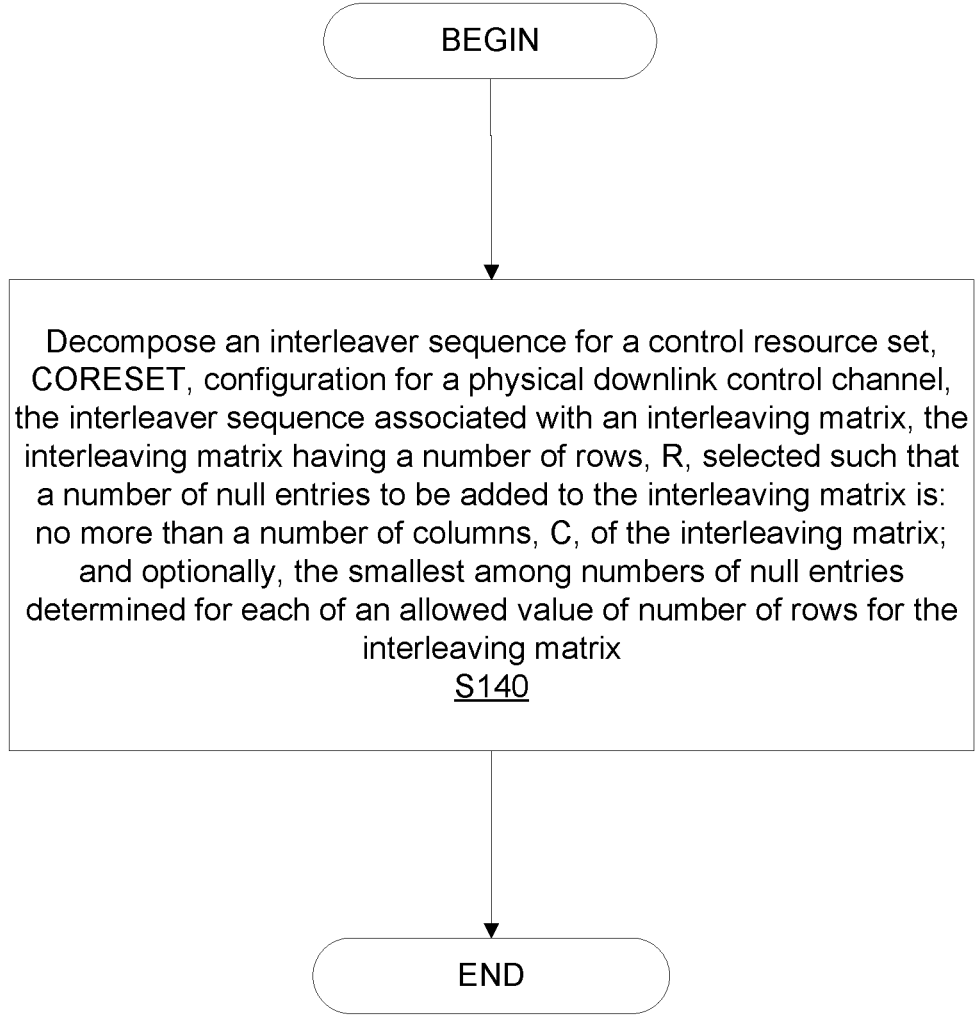
FIG. 15 is a flowchart of an exemplary process in a wireless device for decomposing an interleaved sequence.

FIG. 15 is a flowchart of an exemplary process in a wireless device 22 for decomposing an interleaver sequence. The process includes decomposing (block S140), such as via interleaver sequence decomposer unit 34 and/or processing circuitry 84, an interleaver sequence for a control resource set, CORESET, configuration for a physical downlink control channel, the interleaver sequence associated with an interleaving matrix, the interleaving matrix having a number of rows, R, selected such that a number of null entries to be added to the interleaving matrix is: no more than a number of columns, C, of the interleaving matrix; and optionally, the smallest among numbers of null entries determined for each of an allowed value of number of rows for the interleaving matrix.

In some embodiments, the number of null entries is no more than a width of the interleaver matrix, the interleaver matrix including the interleaver sequence. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D - 1, \text{ and } r = 1, 2 \ldots, R - 1 \\ cR + r - D & \text{if } c = D, D + 1, \ldots, C - 1, \text{ and } r = 0, 1 \ldots, R - 1 \end{cases}$$

$$C = \lceil N_{REG}^{CORESET}/(LR) \rceil$$

$$D = CR - N_{REG}^{CORESET}/L$$

where D equals the number of null entries preceding a sequence 0, ..., $N_{REG}^{CORESET}/L - 1$, and $N_{REG}^{CORESET}$ is a number of resource element groups, REGs, in the CORESET and L is a REG bundle size. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C - D - 1, \text{ and } r = 0, 1, \ldots, R - 1 \\ cR + r - c + C - D & \text{if } c = C - D, \ldots, C - 1, \text{ and } r = 0, 1, \ldots, R - 2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments, the interleaver sequence is decomposed, such as via interleaver sequence decomposer unit 34 and/or processing circuitry 84, according to:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th} - 1, \text{ and } r = \underline{r} + 1, \ldots, R - 1 \\ cR + r - c_{th} - \underline{r}(c+1) & \text{if } c = c_{th}, \ldots, C - 1, \text{ and } r = \underline{r}, \ldots, R - 1 \end{cases}$$

$$C = \lceil N_{REG}^{CORESET}/(LR) \rceil$$

$$D = CR - N_{REG}^{CORESET}/L$$

$$\underline{r} = \lfloor \frac{D}{C} \rfloor$$

$$c_{th} = D - \lfloor \frac{D}{C} \rfloor C$$

where D equals the number of null entries added at a beginning of a sequence $0, \ldots, N_{REG}^{CORESET}/L - 1$, and $N_{REG}^{CORESET}$ is a number of resource element groups REGs in the CORESET and L is a REG bundle size. In some embodiments, the interleaver sequence is decomposed, such as via interleaver sequence decomposer unit 34 and/or processing circuitry 84, according to:

$$f(j) = g((j + n_{shshift}) \bmod (N_{REG}^{CORESET}/L))$$

$$g(k) = rC + c$$

$$k = \begin{cases} cR + r - \lfloor \frac{D}{C} \rfloor c & \text{if } c = 0, 1, \ldots, c_{th} - 1, \\ & \text{and } r = 0, 1, \ldots, \bar{r} - 1 \\ cR + r - \lfloor \frac{D}{C} \rfloor c_{th} - (c - c_{th})(\lfloor \frac{D}{C} \rfloor + 1) & \text{if } c = c_{th}, \ldots, C - 1, \\ & \text{and } r = 0, 1, \ldots, \bar{r} - 2 \end{cases}$$

$$C = \lceil N_{REG}^{CORESET}/(LR) \rceil$$

$$D = CR - N_{REG}^{CORESET}/L$$

$$\bar{r} = R - \lfloor \frac{D}{C} \rfloor$$

$$c_{th} = \lceil \frac{D}{C} \rceil C - D$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size. In some embodiments, the method further includes, such as via interleaver sequence decomposer unit 34 and/or processing circuitry 84, writing the interleaver sequence row-wise as entries into a table with R rows and C columns; reading the entries of the table column-wise; and skipping the null entries in the read entries to obtain a final interleaved sequence.

In some embodiments, the process includes decomposing, via the interleaver sequence decomposer unit 34, an interleaver sequence for a control resource set, CORESET, configuration for a physical downlink control channel, the interleaving sequence having an input sequence and at least one null entry.

The following show example embodiments of interleaving sequences. Without loss of generality, let $0, \ldots, N_{REG}^{CORESET}/L - 1$ be in the input sequence to be interleaved by a block interleaver and let D be the number of NULL entries to be added.

Embodiment 1—Adding NULL Entries Preceding the Sequence $0, \ldots, N_{REG}^{CORESET}/L - 1$ with a Restriction on D The interleaved sequence may be computed as follows:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D - 1, \text{ and } r = 1, 2, \ldots, R - 1 \\ cR + r - D & \text{if } c = D, D+1, \ldots, C - 1, \text{ and } r = 0, 1, \ldots, R - 1 \end{cases}$$

$$C = \lceil N_{REG}^{CORESET}/(LR) \rceil$$

$$D = CR - N_{REG}^{CORESET}/L$$

where, D equals the number of NULL entries added preceding the sequence $0, \ldots, N_{REG}^{CORESET}/L - 1$.

Figure 16:
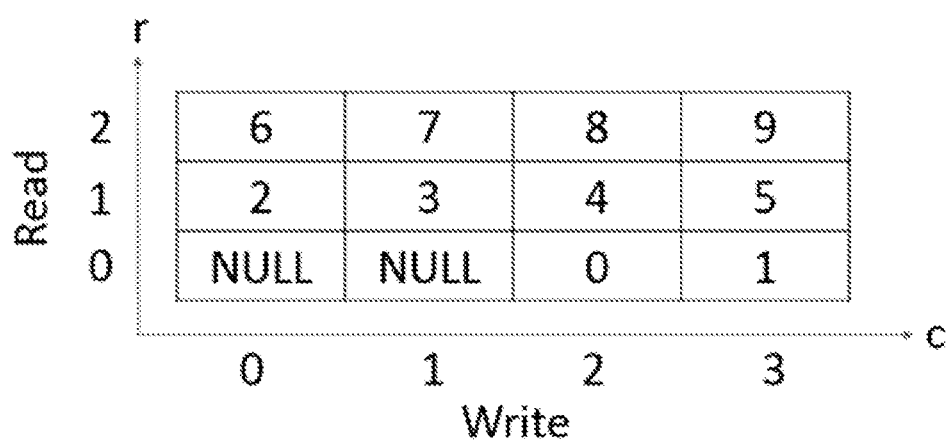
FIG. 16 is an illustration of an interleaver matrix in table form.

It may be assumed that $D \leq C$, i.e., the CORESET configuration and R are selected such that the number of NULL entries are no more than the width of an interleaver matrix. An example is used to explain the above formulas. Consider again the case with $N_{RB}^{CORESET}=30$, $N_{symb}^{CORESET}=2$. There are $N_{REG}^{CORESET}=60$ REGs. With bundle size L=6, we have $N_{REG}^{CORESET}/L=10$ bundles. With CORESET-interleaver-size R=3, we have C=4. In this case, $D=CR-N_{REG}^{CORESET}/L=2$. As a result, we add 2 NULL entries to the sequence $0, \ldots, N_{REG}^{CORESET}/L - 1$, and write the entries in a rectangular matrix of dimension 3×4 as shown in FIG. 16.

In this case:
If c=0, 1, ..., D−1=0, 1, then r=1, 2 ..., R−1=1, 2. As a result, k=cR+r−c−1=0, 1, 2, 3 and g(k)=rC+c−D=2, 6, 3, 7. Analogously, we read column by column of the first D=2 columns of the table in FIG. 16 but skip the NULL entries.

If c=D, D+1, ..., C−1=2, 3, then r=0, 1, ..., R−1=0, 1, 2. As a result, k=cR+r−D=4, 5, 6, 7, 8, 9 and g(k)=rC+c−D=0, 4, 8, 1, 5, 9. Analogously, we read column by column of the remaining C−D=2 columns of the table in FIG. 16. In this case, no NULL entries need to be skipped.

After we obtain the intermediate sequence cyclic shift of CORESET-interleaver-size $n_{shift}$, is applied to generate the final sequence $f(j)=g((j+n_{shift}) \bmod (N_{REG}^{CORESET}/L))$.

Embodiment 2—Adding NULL Entries at the End of the Sequence 0, . . . , $N_{REG}^{CORESET}/L-1$ with a Restriction on D The interleaved sequenced may be computed as follows:

$$f(j) = g((j+n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$

$$C = \lceil N_{REG}^{CORESET}/(LR) \rceil$$

$$D = CR - N_{REG}^{CORESET}/L$$

where, D equals the number of NULL entries added following the sequence 0, . . . , $N_{REG}^{CORESET}/L-1$. It is assumed that D<=C, i.e., the CORESET configuration and R are selected such that the number of NULL entries are no more than the width of interleaver matrix.

Figure 17:
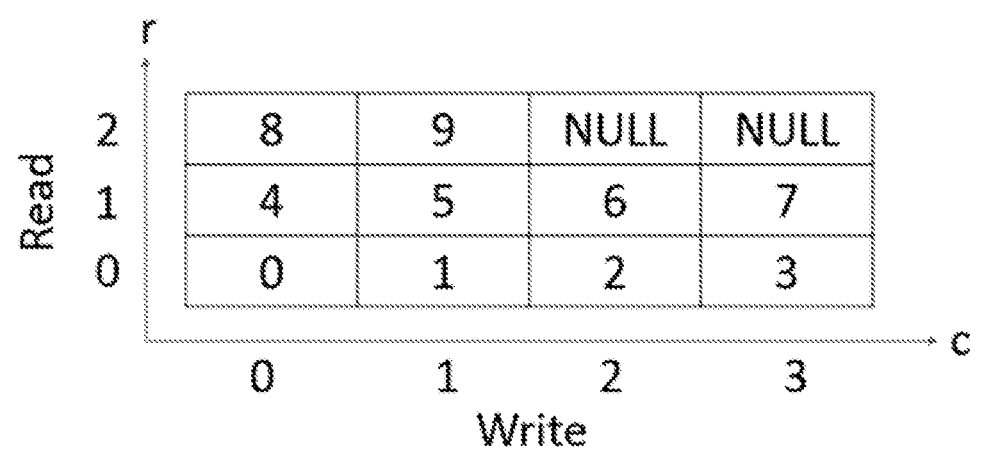

We use an example to explain the above formulas. Consider again the case with $N_{RB}^{CORESET}=30$, $N_{symb}^{CORESET}=2$. There are $N_{REG}^{CORESET}=60$ REGs. With bundle size L=6, we have $N_{RB}^{CORESET}/L=10$ bundles. With CORESET-interleaver-size R=3, we have C=4. In this case, D=$CR-N_{RB}^{CORESET}/L=2$. As a result, we add 2 NULL entries to the sequence 0, . . . , $N_{RB}^{CORESET}/L-1$, and write the entries in a rectangular matrix of dimension 3×4 as shown in FIG. 17.

In this case:
If c=0, 1, . . . , D−1=0, 1, then r=0, 1, . . . , R−1=0, 1, 2. As a result, k=cR+r=0, 1, 2, 3, 4, 5, and g(k)=rC+c=0, 4, 8, 1, 5, 9. Analogously, we read column by column of the first C−D=2 columns of the table in FIG. 17.

If c=C−D, . . . , C−1=2, 3, then r=0, 1, . . . , R−2=0, 1. As a result, k=cR+r−c+C−D=6, 7, 8, 9 and g(k)=rC+c=2, 6, 3, 7. Analogously, we read column by column of the remaining D=2 columns of the table in FIG. 17 but skip the NULL entries.

After we obtain the intermediate sequence g(k), a cyclic shift of CORESET-interleaver-size, $n_{shift}$ is applied to generate the final sequence $f(j)=g((j+n_{shift}) \bmod (N_{RB}^{CORESET}/L))$.

Embodiment 3—Adding NULL Entries Preceding the Sequence 0, . . . , $N_{REG}^{CORESET}/L-1$ without a Restriction on D The interleaved sequenced may be computed as follows:

$$f(j) = g((j+n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \\ & \text{and } r = \underline{r}+1, \ldots, R-1 \\ cR + r - c_{th} - \underline{r}(c+1) & \text{if } c = c_{th}, \ldots, C-1, \\ & \text{and } r = \underline{r}, \ldots, R-1 \end{cases}$$

$$C = \lceil N_{REG}^{CORESET}/(LR) \rceil$$

$$D = CR - N_{REG}^{CORESET}/L$$

-continued $$\underline{r} = \lfloor \frac{D}{C} \rfloor$$

$$c_{th} = D - \lfloor \frac{D}{C} \rfloor C$$

Embodiment 4—Adding NULL Entries at the End of the Sequence 0, . . . , $N_{REG}^{CORESET}/L-1$ without a Restriction on D The interleaved sequenced may be computed as follows:

$$f(j) = g((j+n_{shift}) \bmod (N_{REG}^{CORESET}/L))$$

$$g(k) = rC + c$$

$$k = \begin{cases} cR + r - \lfloor \frac{D}{C} \rfloor c & \text{if } c = 0, 1, \ldots, c_{th}-1, \\ & \text{and } r = 0, 1, \ldots, \bar{r}-1 \\ cR + r - \lfloor \frac{D}{C} \rfloor c_{th} - (c-c_{th})(\lfloor \frac{D}{C} \rfloor +1) & \text{if } c = c_{th}, \ldots, C-1, \\ & \text{and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \lfloor \frac{D}{C} \rfloor$$

$$c_{th} = \lceil \frac{D}{C} \rceil C - D$$

Embodiment 5—Procedure Implementation of the Block Interleaver

Step 1: Insert D NULL entries at arbitrary positions to the sequence 0, . . . , $N_{REG}^{CORESET}/L-1$, where D=$CR-N_{REG}^{CORESET}/L$.

One nonlimiting example is that D NULL entries are added preceding to the sequence 0, . . . , $N_{REG}^{CORESET}/L-1$.

Another nonlimiting example is that D NULL entries are added at the end of the sequence 0, . . . , $N_{REG}^{CORESET}/L-1$.

Step 2: Write the prolonged sequence row-wise into a rectangular table/matrix with R rows and C columns.

Step 3: Read out column-wise the entries in the rectangular table/matrix with R rows and C columns.

Step 4: Skip the NULL entries in the read sequence to get the final interleaved sequence.

Embodiment 6—Selection of the Number of Rows for Block Interleaving

For PDCCH block interleaving, R is selected such that the number of NULL entries to be added is minimized, i.e., $$R = \operatorname{argmin}_{x=2,3,6}(xC - N_{REG}^{CORESET}/L)$$

In another embodiment, R is selected such that the number of NULL entries to be added is no more than the number of columns of the interleaving matrix/table.

Note that although the embodiments described above are for null entries added before OR after the input sequence, some embodiments may include adding null entries before AND after the input sequence.

Some additional embodiments may include one or more of the following:

Embodiment A1. A network node configured to communicate with a wireless device (WD), the network node configured to, and/or comprising a radio interface and/or comprising processing circuitry configured to:
generate an interleaver sequence for a control resource set, CORESET, configuration for a physical downlink control channel, the interleaving sequence having an input sequence and at least one null entry.

Embodiment A2. The network node of Embodiment A1, wherein a number of null entries are no more than a width of an interleaver matrix including the interleaver sequence.

Embodiment A3. The network node of Embodiment A1, wherein the interleaver sequence is computed by:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where D equals the number of null entries preceding a sequence $0, \ldots, N_{REG}^{CORESET}/L-1$, and $N_{REG}^{CORESET}$ is a number of resource element groups REGs in the CORESET and L is a REG bundle size.

Embodiment A4. The network node of Embodiment A1, wherein the interleaver sequence is computed by:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment A5. The network node of Embodiment A1, wherein the interleaver sequence is computed by:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \lfloor D/C \rfloor$$

$$c_{th} = D - \lfloor D/C \rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

Embodiment A6. The network node of Embodiment A1, wherein the interleaver sequence is computed by:

$$f(j) = g((j + n_{shift}) \bmod (N_{REG}^{CORESET}/L))$$

$$g(k) = rC + c$$

$$k = \begin{cases} cR + r - \lfloor D/C \rfloor c & \text{if } c = 0, 1, \ldots, c_{th}-1, \text{ and } r = 0, 1, \ldots, \bar{r}-1 \\ cR + r - \lfloor D/C \rfloor c_{th} - (c - c_{th})(\lfloor D/C \rfloor + 1) & \text{if } c = c_{th}, \ldots, C-1, \text{ and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \lfloor D/C \rfloor$$

$$c_{th} = \lceil D/C \rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment A7. The network node of Embodiment A1, the network node being further configured to:
write the computed interleaver sequence row-wise as entries into a rectangular table with R rows and C columns;
read the entries of the rectangular table column-wise;
skip the null entries in the read entries to obtain a final interleaved sequence; and
select a number of rows for block interleaving.

Embodiment B1. A communication system including a host computer, the host computer comprising:
processing circuitry configured to provide user data; and
a communication interface configured to forward the user data to a cellular network for transmission to a wireless device (WD);
the cellular network comprising a network node having a radio interface and processing circuitry, the network node configured to, and/or the network node's processing circuitry configured to generate an interleaver sequence for a control resource set, CORESET, configuration for a physical downlink control channel, the interleaving sequence having an input sequence and at least one null entry.

Embodiment B2. The communication system of Embodiment B1, further including the network node.

Embodiment B3. The communication system of Embodiment B2, further including the WD, wherein the WD is configured to communicate with the network node.

Embodiment B4. The communication system of Embodiment B3, wherein:
the processing circuitry of the host computer is configured to execute a host application, thereby providing the user data; and the WD comprises processing circuitry configured to execute a client application associated with the host application.

Embodiment C1. A method implemented in a network node, the method comprising
generating an interleaver sequence for a control resource set, CORESET, configuration for a physical downlink control channel, the interleaving sequence having an input sequence and at least one null entry.

Embodiment C2. The method of Embodiment C1, wherein a number of null entries are no more than a width of an interleaver matrix including the interleaver sequence.

Embodiment C3. The method of Embodiment C1, wherein the interleaver sequence is computed by:

$$f(j) = g((j+n_{shift}) \bmod (N_{REG}^{CORESET}/L))$$
$$g(k) = rC + c - D$$
$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$
$$C = \lceil N_{REG}^{CORESET}/(LR) \rceil$$
$$D = CR - N_{REG}^{CORESET}/L$$

where D equals the number of null entries added preceding a sequence $0, \ldots, N_{REG}^{CORESET}/L-1$, and $N_{REG}^{CORESET}$ is a number of resource element groups REGs in the CORESET and L is a REG bundle size.

Embodiment C4. The method of Embodiment C1, wherein the interleaver sequence is computed by:

$$f(j) = g((j+n_{shift}) \bmod (N_{REG}^{CORESET}/L))$$
$$g(k) = rC + c$$
$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$
$$C = \lceil N_{REG}^{CORESET}/(LR) \rceil$$
$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment C5. The method of Embodiment C1, wherein the interleaver sequence is computed by:

$$f(j) = g((j+n_{shift}) \bmod (N_{REG}^{CORESET}/L))$$
$$g(k) = rC + c - D$$
$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{\downarrow h} - \underline{r}(c+1) & \text{if } c = c_{th}, \ldots, C-1, \text{ and } r = \underline{r}, \ldots, R-1 \end{cases}$$
$$C = \lceil N_{REG}^{CORESET}/(LR) \rceil$$
$$D = CR - N_{REG}^{CORESET}/L$$
$$\underline{r} = \lfloor \frac{D}{C} \rfloor$$
$$c_{th} = D - \lfloor \frac{D}{C} \rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

Embodiment C6. The method of Embodiment C1, wherein the interleaver sequence is computed by:

$$f(j) = g((j+n_{shift}) \bmod (N_{REG}^{CORESET}/L))$$
$$g(k) = rC + c$$
$$k = \begin{cases} cR + r - \lfloor \frac{D}{C} \rfloor c & \text{if } c = 0, 1, \ldots, c_{th}-1, \\ & \text{and } r = 0, 1, \ldots, \bar{r}-1 \\ cR + r - \lfloor \frac{D}{C} \rfloor c_{\downarrow h} - (c - c_{\downarrow h})(\lfloor \frac{D}{C} \rfloor + 1) & \text{if } c = c_{th}, \ldots, C-1, \\ & \text{and } r = 0, 1, \ldots, \bar{r}-2 \end{cases}$$
$$C = \lceil N_{REG}^{CORESET}/(LR) \rceil$$
$$D = CR - N_{REG}^{CORESET}/L$$
$$\bar{r} = R - \lfloor \frac{D}{C} \rfloor$$
$$c_{th} = \lceil \frac{D}{C} \rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment C1. The method of Embodiment C1, further comprising:

writing the computed interleaver sequence row-wise as entries into a rectangular table with R rows and C columns;

reading the entries of the rectangular table column-wise;

skipping the null entries in the read entries to obtain a final interleaved sequence; and selecting a number of rows for block interleaving.

Embodiment D1. A method implemented in a communication system including a host computer, a network node and a wireless device (WD), the method comprising:

at the host computer, providing user data; and at the host computer, initiating a transmission carrying the user data to the WD via a cellular network comprising the network node, wherein the network node generates an interleaver sequence for a control resource set, CORESET, configuration for a physical downlink control channel, the interleaving sequence having an input sequence and at least one null entry.

Embodiment D2. The method of Embodiment D1, further comprising, at the network node, transmitting the user data.

Embodiment D3. The method of Embodiment D2, wherein the user data is provided at the host computer by executing a host application, the method further comprising, at the WD, executing a client application associated with the host application.

Embodiment E1. A wireless device (WD) configured to communicate with a network node, the WD configured to, and/or comprising a radio interface and/or processing circuitry configured to:

decompose an interleaver sequence for a control resource set, CORESET, configuration for a physical downlink control channel, the interleaving sequence having an input sequence and at least one null entry.

Embodiment E2. The WD of Embodiment E1, wherein a number of null entries are no more than a width of an interleaver matrix including the interleaver Sequence.

Embodiment E3. The WD of Embodiment E1, wherein the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2, \ldots, R-1 \\ cR + r - D & \text{if } c = D, D+1, \ldots, C-1, \text{ and } r = 0, 1, \ldots, R-1 \end{cases}$$

$$C = \lceil N_{REG}^{CORESET}/(LR) \rceil$$

$$D = CR - N_{REG}^{CORESET}/L$$

where D equals the number of null entries added preceding a sequence $0, \ldots, N_{REG}^{CORESET}/L-1$, and $N_{REG}^{CORESET}$ is a number of resource element groups REGs in the CORESET and L is a REG bundle size.

Embodiment E4. The WD of Embodiment E1, wherein the interleaver sequence is decomposed according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1, \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment E5. The WD of Embodiment E1, wherein the interleaver sequence is computed by:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \\ & \text{and } r = \underline{r}+1, \ldots, R-1 \\ cR + r - c_{\downarrow h} - \underline{r}(c+1) & \text{if } c = c_{th}, \ldots, C-1, \\ & \text{and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \lfloor \frac{D}{C} \rfloor$$

$$c_{th} = D - \lfloor \frac{D}{C} \rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

Embodiment E6. The WD of Embodiment E1, wherein the interleaver sequence is computed by:

$$f(j) = g((j + n_{shift}) \bmod (N_{REG}^{CORESET}/L))$$

$$g(k) = rC + c$$

-continued $$k = \begin{cases} cR + r - \lfloor \frac{D}{C} \rfloor c & \text{if } c = 0, 1, \ldots c_{th}-1, \\ & \text{and } r = 0, 1, \ldots, \bar{r}-1 \\ cR + r - \lfloor \frac{D}{C} \rfloor c_{th} - (c - c_{th})(\lfloor \frac{D}{C} \rfloor + 1) & \text{if } c = c_{th}, \ldots C-1, \\ & \text{and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \lfloor \frac{D}{C} \rfloor$$

$$c_{th} = \lceil \frac{D}{C} \rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

Embodiment E7. The WD of Embodiment E1, the network node being further configured to:

write the computed interleaver sequence row-wise as entries into a rectangular table with R rows and C columns;

read the entries of the rectangular table column-wise;

skip the null entries in the read entries to obtain a final interleaved sequence; and select a number of rows for block interleaving.

Embodiment F1. A communication system including a host computer, the host computer comprising:

processing circuitry configured to provide user data; and a communication interface configured to forward user data to a cellular network for transmission to a wireless device (WD);

the WD configured to, and/or comprising a radio interface and/or processing circuitry configured to decompose an interleaver sequence for a control resource set, CORESET, configuration for a physical downlink control channel, the interleaving sequence having an input sequence and at least one null entry.

Embodiment F2. The communication system of Embodiment F1, further including the WD.

Embodiment F3. The communication system of Embodiment F2, wherein the cellular network further includes a network node configured to communicate with the WD.

Embodiment F4. The communication system of Embodiment F2 or F3, wherein:

the processing circuitry of the host computer is configured to execute a host application, thereby providing the user data; and the WD's processing circuitry is configured to execute a client application associated with the host application.

Embodiment G1. A method implemented in a wireless device (WD), the method comprising decomposing an interleaver sequence for a control resource set, CORESET, configuration for a physical downlink control channel, the interleaving sequence having at least one null entry that at least one of precedes and follows an input sequence.

Embodiment G2. The method of Embodiment G1, wherein a number of null entries are no more than a width of an interleaver matrix including the interleaver sequence.

Embodiment G3. The method of Embodiment G1, wherein the interleaver sequence is decomposed according to:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2, \ldots, R-1 \\ cR + r - D & \text{if } c = D, D+1, \ldots, C-1, \text{ and } r = 0, 1, \ldots, R-1 \end{cases}$$

$$C = \lceil N_{REG}^{CORESET}/(LR) \rceil$$

$$D = CR - N_{REG}^{CORESET}/L$$

where D equals the number of null entries added preceding a sequence $0, \ldots, N_{REG}^{CORESET}/L - 1$, and $N_{REG}^{CORESET}$ is a number of resource element groups REGs in the CORESET and L is a REG bundle size.

Embodiment G4. The method of Embodiment G1, wherein the interleaver sequence is decomposed according to:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1, \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size.

Embodiment G5. The method of Embodiment G1, wherein the interleaver sequence is computed by:

$$f(j) = g((j + n_{shift}) \bmod (N_{REG}^{CORESET}/L))$$

$$g(k) = rC + c - D$$

$$k = \begin{cases} cR + r - (\underline{r} + 1)(c+1) & \text{if } c = 0, 1, \ldots, c_{th} - 1, \text{ and } r = \underline{r} + 1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L - 1$, and $N_{REG}^{CORESET}$ is a number of resource element groups REGs in the CORESET and L is a REG bundle size.

Embodiment G6. The method of Embodiment G1, wherein the interleaver sequence is computed by:

$$f(j) = g((j + n_{shift}) \bmod (N_{REG}^{CORESET}/L))$$

$$g(k) = rC + c$$

$$k = \begin{cases} cR + r - \left\lfloor \frac{D}{C} \right\rfloor c & \text{if } c = 0, 1, \ldots, c_{th} - 1, \text{ and } r = 0, 1, \ldots, \bar{r} - 1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \text{ and } r = 0, 1, \ldots, \bar{r} - 2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L - 1$, and $N_{REG}^{CORESET}$ is a number of resource element groups REGs in the CORESET and L is a REG bundle size.

Embodiment G7. The method of Embodiment G1, the method further comprising:
writing the computed interleaver sequence row-wise as entries into a rectangular table with R rows and C columns;
reading the entries of the rectangular table column-wise;
skipping the null entries in the read entries to obtain a final interleaved sequence; and
selecting a number of rows for block interleaving.

Embodiment H1. A method implemented in a communication system including a host computer, a network node and a wireless device (WD), the method comprising:
at the host computer, providing user data; and at the host computer, initiating a transmission carrying the user data to the WD via a cellular network comprising the network node, wherein the WD decomposes an interleaver sequence for a control resource set, CORESET, configuration for a physical downlink control channel, the interleaving sequence having an input sequence and at least one null entry.

Embodiment H2. The method of Embodiment H1, further comprising, at the WD, receiving the user data from the network node.

Embodiment I1. A network node, comprising:
a memory module configured to store an interleaver sequence
an interleaver sequence generator module configured to generate an interleaver sequence for a control resource set, CORESET, configuration for a physical downlink control channel, the interleaving sequence having an input sequence and at least one null entry.

Embodiment I2. A wireless device, comprising:
a memory module configured to store an interleaver sequence
an interleaver sequence decomposer module configured to decompose an interleaver sequence for a control resource set, CORESET, configuration for a physical downlink control channel, the interleaving sequence having an input sequence and at least one null entry.

Some additional embodiments may include one or more of the following:

In NR, the CCE-to-REG mapping for a CORESET can be interleaved or non-interleaved. Interleaving operates on the REG bundles. The interleaving pattern is defined by a rectangular matrix: the number of rows, R, is configured from {2, 3, 6}, and the number of columns is P/R, where P is the total number of REG bundles for the given CORESET. REG bundles are written row-wise and read column-wise. Cyclic shift of the interleaving unit is applied based on a configurable ID with range 0-274.

The interleaver is defined in Section 7.3.2.2, TS 38.21. In some embodiments, an issue may be identified with the current definition of the interleaver and a proposal to fix the issue may be provided.

DISCUSSION

According to the current NR specification, the interleaver is defined by $$f(j) = (rC + c + n_{shift}) \mod (N_{REG}^{CORESET}/L)$$

j=cR+r
r=0, 1, . . . , R−1
c=0, 1, . . . , C−1
C=⌈$N_{REG}^{CORESET}$/(LR)⌉ where $N_{REG}^{CORESET}$ is the number of REGs in the CORESET, L is the REG bundle size, R∈{2, 3, 6} is given by the higher-layer parameter CORESET-interleaver-size and $n_{shift}$ is a configurable shift. The number of REG bundles is $N_{REG}^{CORESET}$/L, which is an integer since $N_{REG}^{CORESET}$ is divisible by 6 and L∈{2, 6} when the CORESET does not span more than 2 OFDM symbols and L∈{3, 6} when the CORESET uses 3 OFDM symbols.

Figure 18:
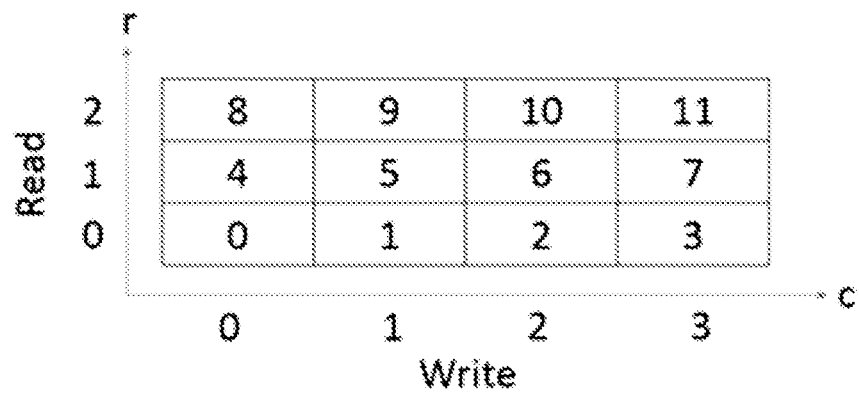
FIG. 18 is an example table of 12 REG bundles.

The current interleaver definition works if the number of REG bundles is divisible by the selected R. For example, with 12 REG bundles, setting we have C=4. Then 12 REG bundles are written row-wise to a table with 3 rows and 4 columns as shown in the example table of FIG. 18. Reading out the entries column-wise, we get the interleaving sequence {0, 4, 8, 1, 5, 9, 2, 6, 10, 3, 7, 11}, as defined by the formulas in the current NR specification.

The current definition fails when CR=$N_{REG}^{CORESET}$/L is not true. For example, with 10 REG bundles, setting R=3, we have C=4. For j=8, we have c=2, r=2, which gives f(8)=10 mod 10=0 (assuming $n_{shift}$). This is invalid since f(0)=0 too, i.e., an element in the interleaving matrix is read by more than once.

The PDCCH interleaver definition in the current TS 38.211 is not correct if the number of REG bundles $N_{REG}^{CORESET}$/L is not divisible by R.

To fix the issue, the block interleaver may insert NULL entries to fill up the interleaving table when writing to the table and skip the NULL entries when reading from the table. With this approach, the write table in the above example with 10 REG bundles and R=3 corresponds to the table shown in FIG. 16. When reading out, the NULL entries are skipped, resulting in the interleaving sequence {2, 6, 3, 7, 0, 4, 8, 1, 5, 9}.

If CR>$N_{REG}^{CORESET}$/L, similar to LTE block interleaver, D=CR−$N_{REG}^{CORESET}$/L NULL entries are padded to the sequence 0, . . . , $N_{REG}^{CORESET}$/L−1 for PDCCH interleaving.

Figure 19:
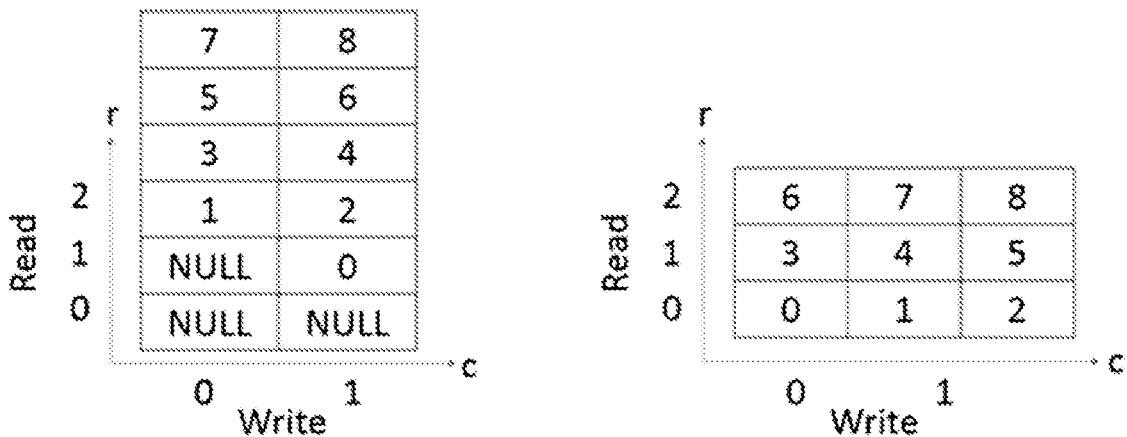
FIG. 19 is an example of tables of 9 REG bundles with and without padding.

The number of rows R for PDCCH block interleaving can be 2, 3, or 6. With a given number of REG bundles, some value(s) of R may result in suboptimal interleaving sequence(s). For example, with 9 REG bundles, setting R=6, we have C=2. Then 9 REG bundles are written row-wise to a table with 6 rows and 2 columns, assuming 3 NULL entries are padded at the beginning, as illustrated in the left table shown in FIG. 19. This results in the interleaving sequence {1, 3, 5, 7, 0, 2, 4, 6, 8}. If we instead set R=3, no NULL entries need to be padded, as illustrated in the right table shown in FIG. 19. The resulting interleaving sequence {0, 3, 6, 1, 4, 7, 2, 5, 8} is a better one compared to the one with R=6.

The above example illustrates that some restriction on the selection of R will be beneficial. In general, R should be selected such that it minimizes the number of NULL entries to be padded. This ensures that the block interleaving matrix is as close to a square matrix as possible and leads to better interleaving sequences.

A more relaxed condition could be that the number of NULL entries to be padded should not be larger than the number of columns in the block interleaving matrix. In other words, the consecutive NULL entries to be padded are restricted in the first row of the matrix.

The number of rows R should be selected such that the number of padded NULL entries is no more than the number of columns in the block interleaving matrix.

Text Proposal

Based on the discussion above, the technical specification may be as follows:

7.3.2.2 Control-resource set (CORESET)

A control-resource set consists of $N_{RB}^{CORESET}$ resource blocks in the frequency domain, given by the higher-layer parameter CORESET-freq-dom, and $N_{symb}^{CORESET}$∈{1, 2, 3} symbols in the time domain, given by the higher-layer parameter CORESET-time-dur, where $N_{symb}^{CORESET}$=3 is supported only if higher-layer parameter DL-DMRS-typeA-pos equals 3.

A control-channel element consists of 6 resource-element groups (REGs) where a resource-element group equals one resource block during one OFDM symbol. Resource-element groups within a control-resource set are numbered in increasing order in a time-first manner, starting with 0 for the first OFDM symbol and the lowest-numbered resource block in the control resource set.

A UE can be configured with multiple control-resource sets. Each control-resource set is associated with one CCE-to-REG mapping only.

The CCE-to-REG mapping for a control-resource set can be interleaved or non-interleaved, configured by the higher-layer parameter CORESET-CCE-REG-mapping-type, and is described by REG bundles:

REG bundle i is defined as REGs {iL, iL+1, . . . , iL+L−1} where L is the REG bundle size, i=0, 1, . . . , $N_{REG}^{CORESET}$, and $N_{REG}^{CORESET}$=$N_{RB}^{CORESET}$$N_{symb}^{CORESET}$ is the number of REGs in the CORESET CCE j consists of REG bundles {f(6j/L), f(6j/L+1), . . . , f(6j/L+6/L−1)} where f(•) is an interleaver For non-interleaved CCE-to-REG mapping, L=6 and f(j)=j For interleaved CCE-to-REG mapping, L∈{2,6} for $N_{symb}^{CORESET}$=1 and L∈{$N_{symb}^{CORESET}$,6} for $N_{symb}^{CORESET}$∈{2,3} here L is configured by the higher-layer parameter CORESET-REG-bundle-size. The interleaver is defined by $$f(j) = g((j + n_{shift}) \mod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2 \ldots, R-1 \\ cR + r - D & \text{if } c = D, D+1, \ldots, C-1, \text{ and } r = 0, 1 \ldots, R-1 \end{cases}$$

$$C = \lceil N_{REG}^{CORESET}/(LR) \rceil$$

$$D = CR - N_{REG}^{CORESET}/L$$

where R∈{2, 3, 6} is given by the higher-layer parameter CORESET-interleaver-size subject to D≤C and where $n_{shift}$ is a function of $N_{ID}^{cell}$ for a PDCCH transmitted in a CORESET configured by the PBCH or RMSI $n_{shift} \in \{0, 1, \ldots, 274\}$ is a function of the higher-layer parameter CORESET-shift-index.

CONCLUSIONS

Thus, in this contribution, an issue can be identified in the current definition of the PDCCH interleaver in NR specification and a text proposal to fix the issue may be provided.

Observation 1: The PDCCH interleaver definition in the current NR 38.211 is not correct if the number of REG bundles $N_{REG}^{CORESET}/L$ is not divisible by R.

Based on the discussion in this contribution, the following may be proposed:

Proposal 1. If $CR > N_{REG}^{CORESET}/L$, similar to LTE block interleaver, $D = CR - N_{REG}^{CORESET}/L$ NULL entries are padded to the sequence $0, \ldots, N_{REG}^{CORESET}/L - 1$ for PDCCH interleaving.

Proposal 2: The number of rows R should be selected such that the number of padded NULL entries is no more than the number of columns in the block interleaving matrix.

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

Abbreviations that may be used in the preceding description include:
CDM Code Division Multiplex
CQI Channel Quality Information
CRC Cyclic Redundancy Check
DCI Downlink Control Information
DFT Discrete Fourier Transform
DM-RS Demodulation Reference Signal
FDM Frequency Division Multiplex
HARQ Hybrid Automatic Repeat Request
OFDM Orthogonal Frequency Division Multiplex
PAPR Peak to Average Power Ratio
PUCCH Physical Uplink Control Channel
PRB Physical Resource Block
RRC Radio Resource Control
UCI Uplink Control Information It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:
1. A network node configured to communicate with a wireless device (WD), the network node comprising processing circuitry configured to:

generate an interleaver sequence for a control resource set (CORESET) configuration for a physical downlink control channel, the interleaver sequence associated with an interleaving matrix, generating the interleaver sequence includes computing a final sequence selected from a group consisting of at least a first final sequence f(j) being expressed as:

$$f(j) = g((j + n_{shift}) \bmod (N_{REG}^{CORESET}/L))$$

$$g(k) = rC + c - D$$

$$k = \begin{cases} cR + r - c - 1 & \text{if } c = 0, 1, \ldots, D-1, \text{ and } r = 1, 2, \ldots, R-1 \\ cR + r - D & \text{if } c = D, D+1, \ldots, C-1, \text{ and } r = 0, 1, \ldots, R-1 \end{cases}$$

$$C = \lceil N_{REG}^{CORESET}/(LR) \rceil$$

$$D = CR - N_{REG}^{CORESET}/L$$

where g(k) is an intermediate sequence, $n_{shift}$ is a cyclic shift of CORESET-interleaver-size, D equals the number of null entries preceding a $0, \ldots, N_{REG}^{CORESET}/L-1$, $N_{REG}^{CORESET}$ is a number of resource element groups, REGs, in the CORESET, and L is a REG bundle size;

for each one of an allowed value of number of rows for the interleaving matrix, determine a number of null entries to be added to the interleaving matrix; and select a number of rows (R) for the interleaving matrix such that the number of null entries to be added to the interleaving matrix is:

no more than a number of columns (C) of the interleaving matrix.

2. The network node of claim 1, wherein the number of null entries is no more than a width of the interleaver matrix, the interleaver matrix including the interleaver sequence.

3. The network node of claim 1, wherein the group further consists of a second final sequence f(j) being expressed as:

$$f(j) = g((j + n_{shift}) \bmod (N_{REG}^{CORESET}/L))$$

$$g(k) = rC + c$$

$$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1, \ldots, R-2 \end{cases}$$

$$C = \lceil N_{REG}^{CORESET}/(LR) \rceil$$

$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

4. The network node of claim 1, wherein the group further consists of a third final sequence f(j) being expressed as:

$$f(j) = g((j + n_{shift}) \bmod (N_{REG}^{CORESET}/L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET}/(LR) \rceil$$

$$D = CR - N_{REG}^{CORESET}/L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

5. The network node of claim 1, wherein the group further consists of a fourth final sequence f(j) being expressed as:

$$f(j) = g((j + n_{shift}) \bmod (N_{REG}^{CORESET}/L))$$

$$g(k) = rC + c$$

$$k = \begin{cases} cR + r - \left\lceil \frac{D}{C} \right\rceil c & \text{if } c = 0, 1, \ldots, c_{th}-1, \text{ and } r = 0, 1, \ldots, \bar{r}-1 \\ cR + r - \left\lceil \frac{D}{C} \right\rceil c_{th} - (c - c_{th})\left(\left\lceil \frac{D}{C} \right\rceil + 1\right) & \text{if } c = c_{th}, \ldots, C-1, \text{ and } r = 0, 1, \ldots, \bar{r}-2 \end{cases}$$

$$C = \lceil N_{REG}^{CORESET}/(LR) \rceil$$

$$D = CR - N_{REG}^{CORESET}/L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

6. The network node of claim 1, wherein the network node is further configured to:

write the interleaver sequence row-wise as entries into a table with R rows and C columns;

read the entries of the table column-wise; and skip the null entries in the read entries to obtain a final interleaved sequence.

7. A method for a network node configured to communicate with a wireless device (WD) the method comprising:

generating an interleaver sequence for a control resource set (CORESET) configuration for a physical downlink control channel, the interleaver sequence associated with an interleaving matrix, generating the interleaver sequence includes computing a final sequence selected from a group consisting of at least a first final sequence f(j) being expressed as:

$$f(j) = g((j + n_{shift}) \bmod (N_{REG}^{CORESET}/L))$$

$$g(k) = rC + c - D$$

-continued $$k = \begin{cases} cR + r - c - 1 & \text{if } c = 0, 1, \ldots, D-1, \\ & \text{and } r = 1, 2 \ldots, R-1 \\ cR + r - D & \text{if } c = D, D+1, \ldots, C-1, \\ & \text{and } r = 0, 1 \ldots, R-1 \end{cases}$$

$$C = \lceil N_{REG}^{CORESET} / (LR) \rceil$$

$$D = CR - N_{REG}^{CORESET} / L$$

where q(k) is an intermediate sequence, $n_{shift}$ is a cyclic shift of CORESET-interleaver-size, D equals the number of null entries preceding a $0, \ldots, N_{REG}^{CORESET}/L-1$, $N_{REG}^{CORESET}$ is a number of resource element groups, REGs, in the CORESET, and L is a REG bundle size;

for each one of an allowed value of number of rows for the interleaving matrix, determining a number of null entries to be added to the interleaving matrix; and selecting a number of rows (R) for the interleaving matrix such that the number of null entries to be added to the interleaving matrix is:
no more than a number of columns (C) of the interleaving matrix.

8. The method of claim 7, wherein the number of null entries is no more than a width of the interleaver matrix, the interleaver matrix including the interleaver sequence.

9. The method of claim 7, wherein the group further consists of a second final sequence f(j) being expressed as:

$$f(j) = g((j + n_{shift}) \bmod (N_{REG}^{CORESET} / L))$$

$$g(k) = rC + c$$

$$k = \begin{cases} cR + r & \text{if } c = 0, 1, \ldots, C-D-1, \\ & \text{and } r = 0, 1, \ldots, R-2 \\ cR + r - c + C - D & \text{if } c = C-D, \ldots, C-1, \\ & \text{and } r = 0, 1 \ldots, R-2 \end{cases}$$

$$C = \lceil N_{REG}^{CORESET} / (LR) \rceil$$

$$D = CR - N_{REG}^{CORESET} / L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

10. The method of claim 7, wherein the group further consists of a third final sequence f(j) being expressed as:

$$f(j) = g((j + n_{shift}) \bmod (N_{REG}^{CORESET} / L))$$

$$g(k) = rC + c - D$$

$$k = \begin{cases} cR + r - (\underline{r}+1)(c+1) & \text{if } c = 0, 1, \ldots, c_{th}-1, \\ & \text{and } r = \underline{r}+1, \ldots, R-1 \\ cR + r - c_{th} - \underline{r}(c+1) & \text{if } c = c_{th}, \ldots, C-1, \\ & \text{and } r = \underline{r}, \ldots, R-1 \end{cases}$$

$$C = \lceil N_{REG}^{CORESET} / (LR) \rceil$$

$$D = CR - N_{REG}^{CORESET} / L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

11. The method of claim 7, wherein the group further consists of a fourth final sequence f(j) being expressed as:

$$f(j) = g((j + n_{shift}) \bmod (N_{REG}^{CORESET} / L))$$

$$g(k) = rC + c$$

$$k = \begin{cases} cR + r - \left\lfloor \frac{D}{C} \right\rfloor c & \text{if } c = 0, 1, \ldots, c_{th}-1, \\ & \text{and } r = 0, 1, \ldots, \bar{r}-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \\ & \text{and } r = 0, 1 \ldots, \bar{r}-2 \end{cases}$$

$$C = \lceil N_{REG}^{CORESET} / (LR) \rceil$$

$$D = CR - N_{REG}^{CORESET} / L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

12. The method of claim 7, further comprising:
writing the interleaver sequence row-wise as entries into a table with R rows and C columns;
reading the entries of the table column-wise; and
skipping the null entries in the read entries to obtain a final interleaved sequence.

13. A wireless device (WD) comprising processing circuitry configured to:
decompose an interleaver sequence for a control resource set (CORESET) configuration for a physical downlink control channel, the interleaver sequence associated with an interleaving matrix, decomposing the interleaver sequence includes computing a final sequence selected from a group consisting of at least a first final sequence f(j) being expressed as:

$$f(j) = g((j + n_{shift}) \bmod (N_{REG}^{CORESET} / L))$$

$$g(k) = rC + c - D$$

$$k = \begin{cases} cR + r - c - 1 & \text{if } c = 0, 1, \ldots, D-1, \\ & \text{and } r = 1, 2 \ldots, R-1 \\ cR + r - D & \text{if } c = D, D+1, \ldots, C-1, \\ & \text{and } r = 0, 1 \ldots, R-1 \end{cases}$$

$$C = \lceil N_{REG}^{CORESET} / (LR) \rceil$$

$$D = CR - N_{REG}^{CORESET} / L$$

where q(k) is an intermediate sequence, $n_{shift}$ is a cyclic shift of CORESET-interleaver-size, D equals the number of null entries preceding a $0, \ldots, N_{REG}^{CORESET}/L-1$, $N_{REG}^{CORESET}$ is a number of resource element groups, REGs, in the CORESET, and L is a REG bundle size;

the interleaving matrix having a number of rows (R) selected such that a number of null entries to be added to the interleaving matrix is:

no more than a number of columns (C) of the interleaving matrix.

14. The WD of claim 13, wherein the number of null entries is no more than a width of the interleaver matrix, the interleaver matrix including the interleaver sequence.

15. The WD of claim 13, wherein the group further consists of a second final sequence f(j) being expressed as:

$$f(j) = g((j + n_{shift}) \bmod(N_{REG}^{CORESET}/L))$$
$$g(k) = rC + c$$
$$k = \begin{cases} cR + r & \text{if } c = 0, 1, \ldots, C-D-1, \\ & \text{and } r = 0, 1, \ldots, R-1 \\ cR + r - c + C - D & \text{if } c = C-D, \ldots, C-1, \\ & \text{and } r = 0, 1, \ldots, R-2 \end{cases}$$
$$C = \lceil N_{REG}^{CORESET}/(LR) \rceil$$
$$D = CR - N_{REG}^{CORESET}/L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

16. The WD of claim 13, wherein the group further consists of a third final sequence f(j) being expressed as:

$$f(j) = g((j + n_{shift}) \bmod(N_{REG}^{CORESET}/L))$$
$$g(k) = rC + c - D$$
$$k = \begin{cases} cR + r - (\underline{r}+1)(c+1) & \text{if } c = 0, 1, \ldots, c_{th}-1, \\ & \text{and } r = \underline{r}+1, \ldots, R-1 \\ cR + r - c_{th} - \underline{r}(c+1) & \text{if } c = c_{th}, \ldots, C-1, \\ & \text{and } r = \underline{r}, \ldots, R-1 \end{cases}$$
$$C = \lceil N_{REG}^{CORESET}/(LR) \rceil$$
$$D = CR - N_{REG}^{CORESET}/L$$
$$\underline{r} = \left\lfloor \frac{D}{C} \right\rfloor$$
$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

17. The WD of claim 13, wherein the group further consists of a fourth final sequence f(j) being expressed as:

$$f(j) = g((j + n_{shift}) \bmod(N_{REG}^{CORESET}/L))$$
$$g(k) = rC + c$$
$$k = \begin{cases} cR + r - \left\lfloor \frac{D}{C} \right\rfloor c & \text{if } c = 0, 1, \ldots, c_{th}-1, \\ & \text{and } r = 0, 1, \ldots, \bar{r}-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \\ & \text{and } r = 0, 1, \ldots, \bar{r}-2 \end{cases}$$
$$C = \lceil N_{REG}^{CORESET}/(LR) \rceil$$
$$D = CR - N_{REG}^{CORESET}/L$$

-continued
$$\bar{r} = R - \left\lfloor \frac{D}{C} \right\rfloor$$
$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

18. The WD of claim 13, wherein the WD is further configured to:
write the interleaver sequence row-wise as entries into a table with R rows and C columns;
read the entries of the table column-wise; and
skip the null entries in the read entries to obtain a final interleaved sequence.

19. A method for a wireless device (WD) configured to communicate with a network node, the method comprising:
decomposing an interleaver sequence for a control resource set (CORESET) configuration for a physical downlink control channel, the interleaver sequence associated with an interleaving matrix, decomposing the interleaver sequence includes computing a final sequence selected from a group consisting of at least a first final sequence f(j) being expressed as:

$$f(j) = g((j + n_{shift}) \bmod(N_{REG}^{CORESET}/L))$$
$$g(k) = rC + c - D$$
$$k = \begin{cases} cR + r - c - 1 & \text{if } c = 0, 1, \ldots, D-1, \\ & \text{and } r = 1, 2, \ldots, R-1 \\ cR + r - D & \text{if } c = D, D+1, \ldots, C-1, \\ & \text{and } r = 0, 1, \ldots, R-1 \end{cases}$$
$$C = \lceil N_{REG}^{CORESET}/(LR) \rceil$$
$$D = CR - N_{REG}^{CORESET}/L$$

where q(k) is an intermediate sequence, $n_{shift}$ is a cyclic shift of CORESET-interleaver-size, D equals the number of null entries preceding a $0, \ldots, N_{REG}^{CORESET}/L-1$, $N_{REG}^{CORESET}$ is a number of resource element groups, REGs, in the CORESET, and L is a REG bundle size;
the interleaving matrix having a number of rows (R) selected such that a number of null entries to be added to the interleaving matrix is:
no more than a number of columns (C) of the interleaving matrix.

20. The method of claim 19, wherein the number of null entries is no more than a width of the interleaver matrix, the interleaver matrix including the interleaver sequence.

21. The method of claim 19, wherein the group further consists of a second final sequence f(j) being expressed as:

$$f(j) = g((j + n_{shift}) \bmod(N_{REG}^{CORESET}/L))$$
$$g(k) = rC + c$$

-continued $$k = \begin{cases} cR + r & \text{if } c = 0, 1, \ldots, C-D-1, \text{ and } r = 0, 1, \ldots, R-1 \\ cR + r - c + C - D & \text{if } c = C-D, \ldots, C-1, \text{ and } r = 0, 1 \ldots, R-2 \end{cases}$$

$$C = \lceil N_{REG}^{CORESET} / (LR) \rceil$$

$$D = CR - N_{REG}^{CORESET} / L$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

22. The method of claim 19, wherein the group further consists of a third final sequence f(j) being expressed as:

$$f(j) = g((j + n_{shift}) \mod(N_{REG}^{CORESET} / L))$$

$$g(k) = rC + c - D$$

$$k = \begin{cases} cR + r - (\underline{r}+1)(c+1) & \text{if } c = 0, 1, \ldots, c_{th}-1, \text{ and } r = \underline{r}+1, \ldots, R-1 \\ cR + r - c_{th} - \underline{r}(c+1) & \text{if } c = c_{th}, \ldots, C-1, \text{ and } r = \underline{r}, \ldots, R-1 \end{cases}$$

$$C = \lceil N_{REG}^{CORESET} / (LR) \rceil$$

$$D = CR - N_{REG}^{CORESET} / L$$

$$\underline{r} = \left\lfloor \frac{D}{C} \right\rfloor$$

$$c_{th} = D - \left\lfloor \frac{D}{C} \right\rfloor C$$

where D equals the number of null entries added at a beginning of a sequence $0, \ldots, N_{REG}^{CORESET}/L-1$, and $N_{REG}^{CORESET}$ is a number of resource element groups REGs in the CORESET and L is a REG bundle size.

23. The method of claim 19, wherein the group further consists of a fourth final sequence f(j) being expressed as:

$$f(j) = g((j + n_{shift}) \mod(N_{REG}^{CORESET} / L))$$

$$g(k) = rC + c$$

$$k = \begin{cases} cR + r - \left\lfloor \frac{D}{C} \right\rfloor c & \text{if } c = 0, 1, \ldots, c_{th}-1, \text{ and } r = 0, 1, \ldots, \bar{r}-1 \\ cR + r - \left\lfloor \frac{D}{C} \right\rfloor c_{th} - (c - c_{th})\left(\left\lfloor \frac{D}{C} \right\rfloor + 1\right) & \text{if } c = c_{th}, \ldots, C-1, \text{ and } r = 0, 1 \ldots, \bar{r}-2 \end{cases}$$

$$C = \lceil N_{REG}^{CORESET} / (LR) \rceil$$

$$D = CR - N_{REG}^{CORESET} / L$$

$$\bar{r} = R - \left\lfloor \frac{D}{C} \right\rfloor$$

$$c_{th} = \left\lceil \frac{D}{C} \right\rceil C - D$$

where D equals the number of null entries added at an end of a sequence $0, \ldots, N_{REG}^{CORESET}/L-1$, and $N_{REG}^{CORESET}$ is a number of resource element groups REGs in the CORESET and L is a REG bundle size.

24. The method of claim 19, further comprising:
writing the interleaver sequence row-wise as entries into a table with R rows and C columns;
reading the entries of the table column-wise; and
skipping the null entries in the read entries to obtain a final interleaved sequence.

* * * * *